(12) United States Patent
Shibayama et al.

(10) Patent No.: US 11,188,001 B2
(45) Date of Patent: Nov. 30, 2021

(54) ALIGNMENT APPARATUS, ALIGNMENT METHOD, LITHOGRAPHY APPARATUS, AND METHOD OF MANUFACTURING ARTICLE

(71) Applicant: CANON KABUSHIKI KAISHA, Tokyo (JP)

(72) Inventors: Takashi Shibayama, Utsunomiya (JP); Takamitsu Komaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 267 days.

(21) Appl. No.: 16/433,051

(22) Filed: Jun. 6, 2019

(65) Prior Publication Data

US 2019/0285996 A1   Sep. 19, 2019

Related U.S. Application Data

(63) Continuation of application No. PCT/JP2017/042002, filed on Nov. 22, 2017.

(30) Foreign Application Priority Data

Dec. 16, 2016 (JP) .............................. JP2016-244538

(51) Int. Cl.
*H01L 21/68* (2006.01)
*G03F 9/00* (2006.01)
(Continued)

(52) U.S. Cl.
CPC ............ *G03F 9/7088* (2013.01); *B29C 43/04* (2013.01); *B29C 43/58* (2013.01); *B29C 59/02* (2013.01);
(Continued)

(58) Field of Classification Search
CPC .... G03F 9/7088; G03F 9/7065; G03F 9/7076; G03F 7/0002; B29C 59/02; B29C 43/58; B29C 43/04
(Continued)

(56) References Cited

U.S. PATENT DOCUMENTS 7,927,090 B2   4/2011   Ten Berge
8,703,035 B2   4/2014   Sato
(Continued)

FOREIGN PATENT DOCUMENTS

CN   104765248 A   7/2015
JP   2005032889 A   2/2005
(Continued)

OTHER PUBLICATIONS

Office Action issued in Korean Appln. No. 10-2019-7019697 dated Sep. 18, 2020.
(Continued)

*Primary Examiner* — Hung Nguyen
(74) *Attorney, Agent, or Firm* — Rossi, Kimms & McDowell LLP

(57) ABSTRACT

In an alignment apparatus, a measurement device includes an illuminator that illuminates a first original-side mark and a second original-side mark arranged in an original and a first substrate-side mark and second substrate-side mark arranged in a substrate. The measurement device performs coarse measurement based on light beams from the first original-side mark and the first substrate-side mark by causing the illuminator to illuminate the first original-side mark and the first substrate-side mark under a first condition, and performs fine measurement based on light beams from the second original-side mark and the second substrate-side
(Continued)

mark by causing the illuminator to illuminate the second original-side mark and the second substrate-side mark under a second condition.

12 Claims, 12 Drawing Sheets

(51) Int. Cl.
| | | |
|---|---|---|
| B29C 43/04 | (2006.01) | |
| B29C 43/58 | (2006.01) | |
| G01B 11/27 | (2006.01) | |
| G03F 7/00 | (2006.01) | |
| G01B 11/00 | (2006.01) | |
| B29C 59/02 | (2006.01) | |
| H01L 21/027 | (2006.01) | |

(52) U.S. Cl.
CPC ............ *G01B 11/00* (2013.01); *G01B 11/272* (2013.01); *G03F 7/0002* (2013.01); *G03F 9/00* (2013.01); *G03F 9/7065* (2013.01); *G03F 9/7076* (2013.01); *H01L 21/027* (2013.01); *H01L 21/68* (2013.01)

(58) Field of Classification Search
USPC ..................................................... 355/53, 55
See application file for complete search history.

(56) References Cited

U.S. PATENT DOCUMENTS

| | | |
|---|---|---|
| 8,845,317 B2 | 9/2014 | Suehira et al. |
| 8,922,786 B2 | 12/2014 | Iwai |
| 9,465,308 B2 | 10/2016 | Iwai et al. |
| 2002/0080365 A1* | 6/2002 | Monshouwer ........ G03F 9/7076 356/508 |
| 2010/0195102 A1 | 8/2010 | Den Boef |
| 2016/0039126 A1* | 2/2016 | Tan ........................ B29C 43/58 264/40.5 |
| 2016/0299444 A1 | 10/2016 | Komaki et al. |

FOREIGN PATENT DOCUMENTS

| | | |
|---|---|---|
| JP | 2005167139 A | 6/2005 |
| JP | 2005197591 A | 7/2005 |
| JP | 2008221822 A | 9/2008 |
| JP | 2011181944 A | 9/2011 |
| JP | 2011243664 A | 12/2011 |
| JP | 2012059853 A | 3/2012 |
| JP | 2013102139 A | 5/2013 |
| JP | 2016201423 A | 12/2016 |
| TW | 200613927 A | 5/2006 |
| TW | 201642315 A | 12/2016 |

OTHER PUBLICATIONS

International Search Report issued in Intl. Appln. No. PCT/JP2017/042002 dated Feb. 27, 2018. English translation provided.
Written Opinion issued in Intl. Appln. No. PCT/JP2017/042002 dated Feb. 27, 2018.
Office Action issued in Taiwanese Appln. No. 106142072 dated Jun. 4, 2018.

* cited by examiner

ALIGNMENT APPARATUS, ALIGNMENT METHOD, LITHOGRAPHY APPARATUS, AND METHOD OF MANUFACTURING ARTICLE

CROSS-REFERENCE TO RELATED APPLICATIONS

This application is a Continuation of International Patent Application No. PCT/JP2017/042002, filed Nov. 22, 2017, which claims the benefit of Japanese Patent Application No. 2016-244538, filed Dec. 16, 2016, both of which are hereby incorporated by reference herein in their entirety.

BACKGROUND OF THE INVENTION

Field of the Invention

The present invention relates to an alignment apparatus, an alignment method, a lithography apparatus, and a method of manufacturing an article.

Background Art

As lithography apparatuses for transferring a pattern of an original to a substrate, there are, for example, an exposure apparatus and an imprint apparatus. An exposure apparatus projects, via a projection optical system, the pattern of an original onto a substrate applied with a photosensitive material to form a latent pattern corresponding to the pattern of the original on the photosensitive material. An imprint apparatus forms an imprint material into a pattern corresponding to the pattern of an original by curing the imprint material in a state in which an original (a mold) is in contact with the imprint material arranged on a substrate.

An original and a substrate need to be aligned in a lithography apparatus. PTL 1 discloses, in relation to an imprint apparatus, a method of bringing a mold and a substrate into contact with each other in a state in which an imprint material is interposed between them and performing alignment of the mold and the substrate in this state.

CITATION LIST

Patent Literature

PTL 1: Japanese Patent Laid-Open No. 2011-181944

There is a case in which a plurality of types of alignment marks with different measurement ranges and measurement accuracies from each other are used as alignment marks for alignment. In such a case, the marks may be made of different materials, have different pattern shapes, have different thicknesses, or the like. Alternatively, the reflectance of each mark may differ due to a process layer formed on the marks or the like. In a case in which the reflectance of each mark differs, a difference will be generated between the detected light amounts of light from the plurality of types of marks. This can cause the measurement accuracy of the relative positions of the original and the substrate to degrade, and highly accurate alignment may not be able to be performed.

SUMMARY OF THE INVENTION

The present invention provides, for example, a technique advantageous in increasing the accuracy of alignment of an original and a substrate.

According to one aspect of the present invention, there is provided an alignment apparatus that aligns an original and a substrate, comprising an original holder configured to hold the original, a substrate holder configured to hold the substrate, and a measurement device including an illuminator that illuminates a first original-side mark for coarse measurement and a second original-side mark for fine measurement arranged in one of the original and the original holder and a first substrate-side mark for coarse measurement and second substrate-side mark for fine measurement arranged in one of the substrate and the substrate holder, and configured to measure a positional deviation between the original and the substrate, wherein the measurement device performs coarse measurement based on light beams from the first original-side mark and the first substrate-side mark by causing the illuminator to illuminate the first original-side mark and the first substrate-side mark under a first condition, and performs fine measurement based on light beams from the second original-side mark and the second substrate-side mark by causing the illuminator to illuminate the second original-side mark and the second substrate-side mark under a second condition.

Further features of the present invention will become apparent from the following description of exemplary embodiments (with reference to the attached drawings).

DESCRIPTION OF THE EMBODIMENTS

Embodiments of the present invention will be described in detail hereinafter with reference to the accompanying drawings. Although an alignment apparatus according to the present invention can be applied to an apparatus for aligning an original and a substrate in a lithography apparatus such as an imprint apparatus and an exposure apparatus, it is also applicable to other apparatuses such as a processing apparatus, an inspection apparatus, a microscope, and the like. An example in which the alignment apparatus according to the present invention is applied to an imprint apparatus will be described hereinafter.

First Embodiment

Figure 1:
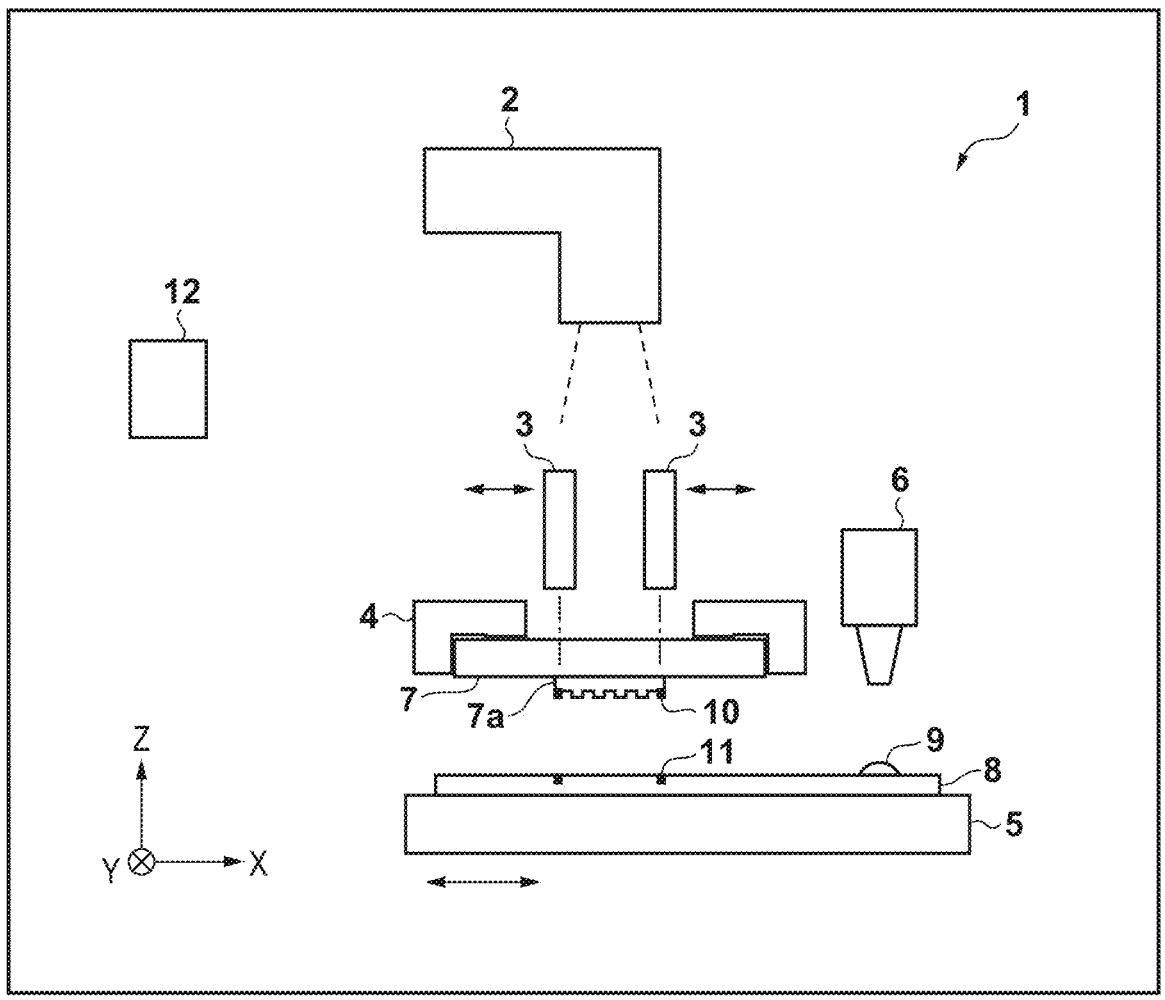
FIG. 1 is a view showing the arrangement of an imprint apparatus according to an embodiment.

The arrangement of an imprint apparatus according to the first embodiment will be described. FIG. 1 is a view showing the representative arrangement of an imprint apparatus 1 according to the embodiment. The imprint apparatus 1 is an apparatus that forms, on a substrate, a pattern of a cured product to which a concave-convex pattern of a mold has been transferred by bringing an imprint material supplied on the substrate and the mold into contact with each other and applying curing energy to the imprint material.

As an imprint material, a curable composition (to be also referred to a resin in an uncured state) that is cured by receiving curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light.

The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component.

The imprint material can be supplied on the substrate in the form of a film by a spin coater or a slit coater. Alternatively, the imprint material may be applied on the substrate in the form of droplets or in the form of an island or film obtained by connecting a plurality of droplets supplied by a liquid injection head. The viscosity (the viscosity at 25° C.) of the imprint material is, for example, 1 mPa·s (inclusive) to 100 mPa·s (inclusive).

Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

Note that a photocuring method will be employed in the imprint apparatus according to this embodiment. In addition, in FIG. 1, the X-axis and the Y-axis are set orthogonal to each other in a plane parallel to a substrate surface, and the Z-axis is set in a direction perpendicular to the X- and Y-axes. The imprint apparatus 1 includes an irradiation unit 2 that performs light irradiation, a measurement device 3 that performs measurement to align a substrate and a mold as an original, a mold holder 4 that holds the mold, a substrate stage 5 that holds the substrate, a supplying unit 6 that supplies an imprint material, and a controller 12.

After a mold pressing process of bringing a mold 7 and an imprint material on a substrate 8 into contact with each other, the irradiation unit 2 irradiates the mold 7 and the imprint material with ultraviolet light to cure the imprint material. The irradiation unit 2 can include a light source that emits ultraviolet light and a plurality of optical elements for irradiating the mold 7 and the imprint material with the ultraviolet light, which is emitted from the light source, in a predetermined shape and in a uniform manner. For example, the light irradiation region (irradiation range) of the irradiation unit 2 can have an area which is about the same size as the surface area of a concave-convex pattern 7a of the mold 7 or an area which is slightly larger than the surface area of the concave-convex pattern 7a. Setting a minimum necessary irradiation range in this manner can suppress the generation of positional deviation and distortion in the imprint material pattern that can be caused by the expansion of the substrate 8 or the mold 7 due to the heat from the irradiation. In addition, this can prevent a state in which an abnormality is generated in a subsequent operation by the supplying unit when an imprint material remaining in the supplying unit 6 is cured by an ultraviolet light beam that is reflected by the substrate 8 and reached the supplying unit 6. For example, a high-pressure mercury lamp, various kinds of excimer lamps, an excimer laser, a light-emitting diode or the like can be employed as the light source. Note that although this light source can be appropriately selected in accordance with the characteristics of the imprint material that serves as a light receiving object, the type or the wavelength of the light source or the number of light sources is not limited.

A predetermined pattern (for example, the concave-convex pattern 7a such as a circuit pattern or the like) is formed three-dimensionally on a surface of the mold 7 which faces the substrate 8. Note that the material of the mold 7 is quartz or the like which is capable of transmitting ultraviolet light.

The mold holder 4 is an original holder that attracts and holds the mold 7 by a vacuum suction force or an electrostatic force. This mold holder 4 can include a chuck which chucks and holds the mold 7, a mold driving mechanism that drives the chuck in the Z-axis direction, and a magnification correction mechanism that corrects the distortion of an imprint material pattern by deforming the mold 7 in the X-axis direction and the Y-axis direction. The mold driving mechanism is provided to bring the mold 7 into contact with the imprint material supplied on the substrate 8. Note that although operations such as mold pressing and mold separating performed by the imprint apparatus 1 can be implemented by moving the mold 7 in the Z direction in this manner, it may also be implemented by for example, moving the substrate stage 5 (that is, the substrate 8) in the Z direction or moving both the mold and the substrate stage.

The substrate stage 5 is a substrate holder that can hold the substrate 8 by, for example, vacuum chucking and move in the X-Y plane. In this case, the substrate 8 is, for example, a processing target object made of a single crystal silicon, and an imprint material 9 to be formed by the mold 7 is supplied to the processing target surface.

The measurement device 3 that performs measurement to align the relative positions of the substrate 8 and the mold 7 detects a mark 10 arranged on the mold 7 or the mold holder 4 and a mark 11 arranged on the substrate 8 or the substrate stage 5 and measures the relative positions of the marks. Assume that the mark 10 is arranged on the mold 7 and the mark 11 is arranged on the substrate in the description hereinafter. The measurement device 3 is formed to be capable of performing driving in the X-axis direction and the Y-axis direction in accordance with the alignment of the marks arranged in the mold 7 or the substrate 8. The measurement device 3 is also formed to be capable of driving in the Z-axis direction to align the focus on the positions of the marks.

The controller 12 is electrically connected to the irradiation unit 2, the measurement device 3, the mold holder 4, the substrate stage 5, and the supplying unit 6, transmits control instructions to and obtains pieces of information from these respective components. For example, the controller 12 obtains the information of the relative positions of the marks measured by the measurement device 3 and controls the driving of a driving unit including the substrate stage 5 and the magnification correction mechanism of the mold holder 4 based on the obtained information. The measurement device 3 and the marks 10 and 11 will be described in detail later. The alignment apparatus according to this embodiment can include, for example, the mold holder 4, the substrate stage 5, the measurement device 3, and the controller 12.

The supplying unit 6 supplies the imprint material 9 on the substrate 8. The imprint material 9 is a photocurable imprint material that has a property that is cured by receiving ultraviolet light, and the imprint material can be appropriately selected depending on the type of the semiconductor device or the like. Note that although the supplying unit 6 is inside the imprint apparatus 1 in FIG. 1, the supplying unit 6 may be arranged outside the imprint apparatus 1 instead of installing the supplying unit inside the imprint apparatus 1. In a case in which the supplying unit 6 is installed outside, it will be arranged so that the substrate 8 onto which the imprint material has been supplied by the supplying unit 6 is loaded into the imprint apparatus 1. According to this arrangement, it is possible to speed up the processing in the imprint apparatus 1 since the step of supplying the imprint material onto the substrate 8 in the imprint apparatus 1 is eliminated.

The imprint process performed by the imprint apparatus 1 will be described next. First, a substrate conveyance unit (not shown) conveys the substrate 8 onto the substrate stage 5 and places and fixes the substrate 8. Next, the substrate stage 5 is moved to the imprint material supplying position of the supplying unit 6, and the supplying unit 6 subsequently supplies the imprint material 9 to an imprint target shot region of the substrate 8 (supplying step). Next, the substrate stage 5 is moved so that the shot region of the substrate 8 is positioned immediately below the mold 7. Next, the mold driving mechanism is driven to bring the mold 7 into contact with the imprint material 9 on the substrate 8 (mold pressing step). As a result, the imprint material 9 flows along the concave-convex pattern 7a formed in the mold 7. Subsequently, the measurement device 3 detects the marks 10 and 11 arranged in the mold 7 and the substrate 8, respectively, alignment of the pattern surface of the mold 7 and the shot region of the substrate 8 is performed by driving the substrate stage 5, and magnification correction of the mold 7 by the magnification correction mechanism is performed. Assume that it has become a state in which the imprint material 9 has sufficiently flowed to the concave-convex pattern 7a and the alignment of the mold 7 and the substrate 8 and the magnification correction of the mold have been performed sufficiently. In this state, the irradiation unit 2 irradiates the back surface (upper surface) of the mold 7 with ultraviolet light and cures the imprint material 9 by the ultraviolet light transmitted through the mold 7 (curing step). At this time, the measurement device 3 is arranged at a position where it will not block the optical path of the ultraviolet light. Next, the mold driving mechanism is driven again to separate the mold 7 from the cured imprint material 9 (mold separating step). By the steps described above, the concave-convex pattern 7a of the mold 7 is transferred to the imprint material 9 on the substrate 8.

Figure 2:
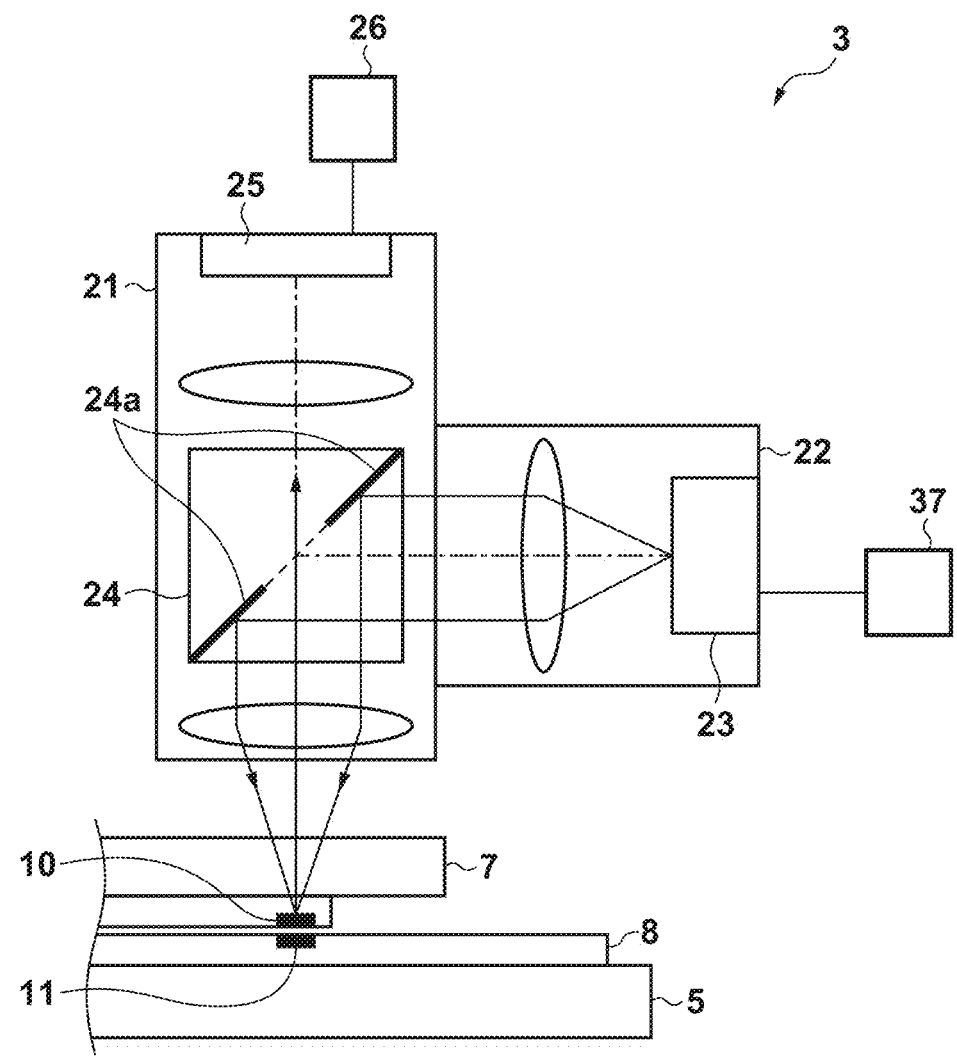
FIG. 2 is a view showing an example of the arrangement of a measurement device.

The measurement device 3 and the marks 10 and 11 (alignment marks) for alignment arranged in the mold 7 and the substrate 8, respectively, will be described in detail next. FIG. 2 is a view showing an example of the arrangement of the measurement device 3 according to this embodiment. The measurement device 3 includes a detection optical system 21 (detector), an illumination optical system 22 (illuminator), a processor 26, and a controller 37. The illumination optical system 22 guides the light from a light source unit 23 onto the same optical axis as the detection optical system 21 by using a prism 24 and illuminates the marks 10 and 11. For example, a halogen lamp, an LED, a semiconductor laser (LD), a high-pressure mercury lamp, or a metal halide lamp can be used as the light source unit 23, and the light source unit is configured to emit infrared light or visible light that does not include ultraviolet light which can cure the imprint material. The controller 37 controls the driving of the light source unit 23. The detection optical system 21 and the illumination optical system 22 are formed so as to share some of the optical members forming these systems, and the prism 24 is arranged on or near the pupil planes of the detection optical system 21 and the illumination optical system 22. The marks 10 and 11 include, for example, diffraction gratings, and the detection optical system 21 forms, on an image sensor 25 (imaging device), an image of interference fringes (moiré fringes) which are generated by the interference between the diffraction gratings from the marks 10 and 11 illuminated by the illumination optical system 22. A CCD, a CMOS, or the like is used as the image sensor 25. The processor 26 obtains and processes the image data captured by the image sensor 25. Since interference fringes (moiré fringes) are generated by the diffracted light of the marks on the mold 7 and the substrate 8, the light amount of the moiré fringes that can be obtained changes depending on the diffraction efficiency of the mold 7 and the substrate 8. Particularly, since the diffraction efficiency changes periodically with respect to the wavelength, there are wavelengths in which moiré fringes can be detected efficiently and wavelengths in which moiré fringes are difficult to detect. In this case, the light of a wavelength in which moiré fringes are difficult to detect can become noise for the measurement signal detected by the image sensor 25. The processor 26 is, for example, a part of the controller 12, obtains the information of an image captured by the image sensor 25 and obtains the relative positions of the mark 10 and mark 11 based on the image. The controller 12 of the measurement device 3 controls an alignment unit based on the obtained relative positions and performs alignment so as to reduce the relative positional deviation between the regions at least including the mark 10 and the mark 11. As a result, the pattern of the substrate and the pattern of the mold can be overlaid with high accuracy.

A reflection film 24a for reflecting the light from the peripheral portion of the pupil plane of the illumination optical system is formed on the bonding surface of the prism 24. The reflection film 24a also acts as an aperture stop that defines a detection NA or the size of the pupil of the detection optical system 21. The prism 24 here is a half prism which has a semi-transparent film on its bonding surface or may be, instead of a prism, a plate-like optical element on which the reflection film has been formed on its surface. Note that it may be arranged so that the center portion of the prism 24 is set as the reflection portion by making the region of the reflection film 24a at the periphery of the prism 24 into a transmission portion, that is, it may have an arrangement in which the position of the light source unit 23 and the position of the image sensor 25 have been switched.

Figure 3:
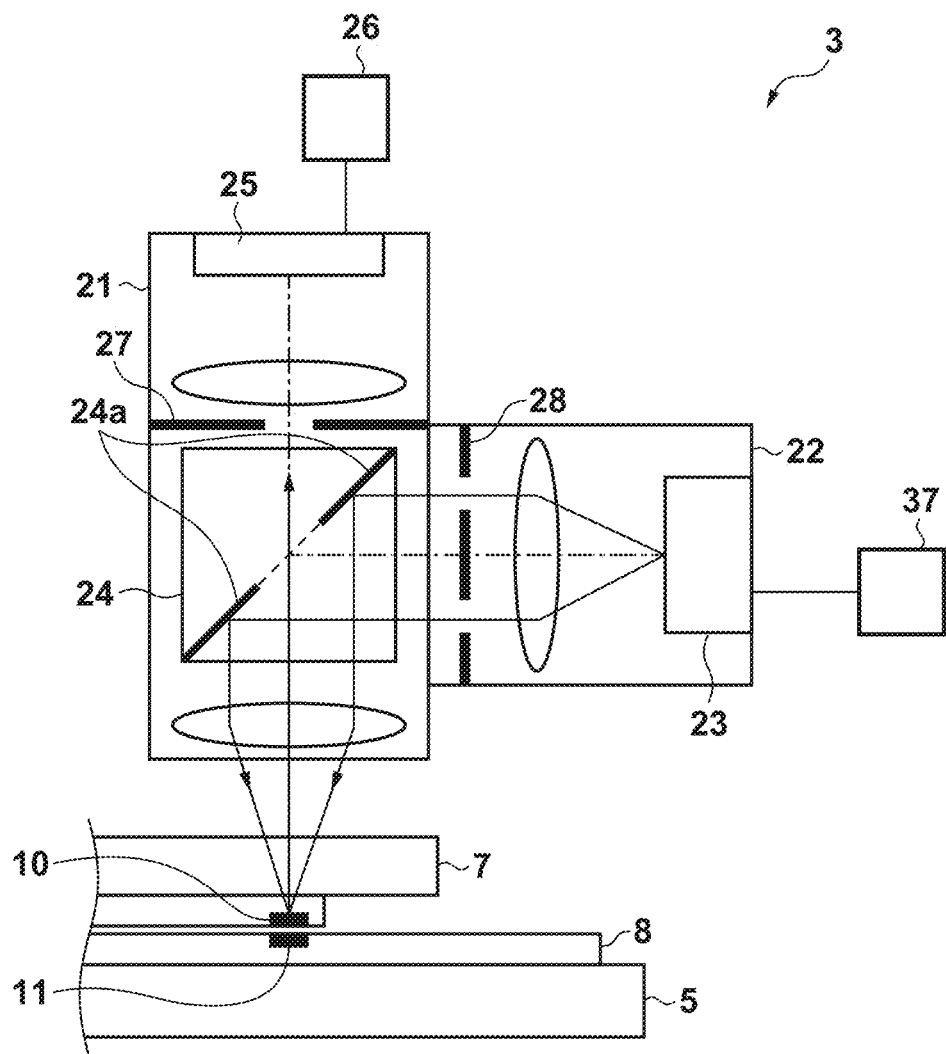
FIG. 3 is a view showing a modification of the arrangement of the measurement device.

The position for determining the light intensity distribution on the pupil plane of the illumination optical system and the detection NA of the detection optical system according to this embodiment need not be the position of the prism 24. For example, as shown in FIG. 3, individual aperture stops 27 and 28 may be arranged for the detection optical system 21 and the illumination optical system 22, respectively. In this arrangement, the detection NA of the detection optical system is determined by the shape of the aperture of the aperture stop 27, and the light intensity distribution on the pupil plane of the illumination optical system is determined by the shape of the aperture of the aperture stop 28. In addition, a half prism that includes a semi-transparent film can be used on the bonding surface of the prism 24.

Figure 4:
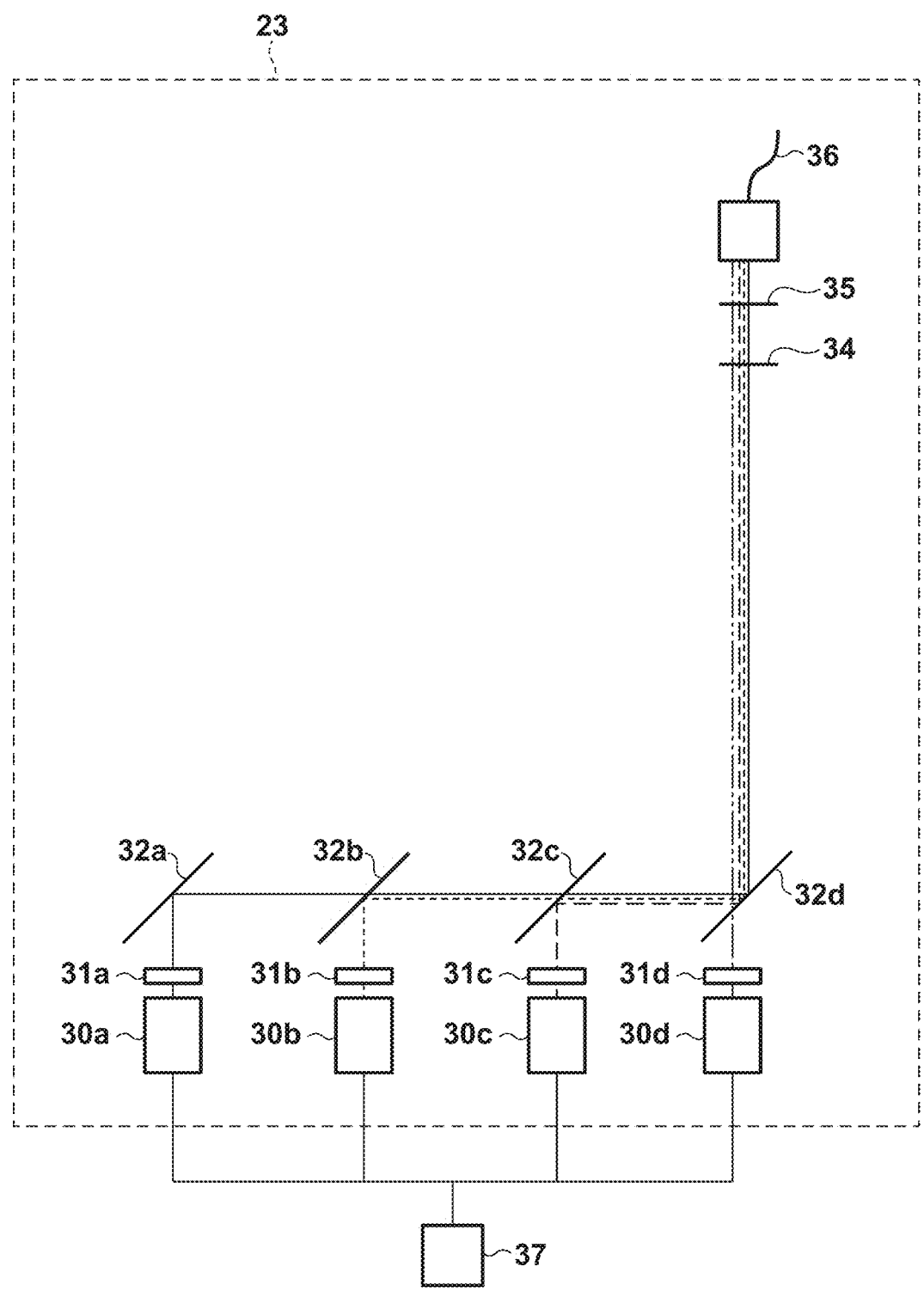
FIG. 4 is a view showing an example of the arrangement of a light source unit in the measurement device.

The light source unit 23 will be described next. FIG. 4 is a view showing the detailed arrangement of the light source unit 23. The light source unit 23 can include a plurality of light sources 30a, 30b, 30c, and 30d (30a to 30d). For example, semiconductor lasers (LD) can be used as the light sources 30a to 30d, but the present invention is not limited to this. An LED, a halogen lamp, a metal halide lamp, a high-pressure mercury lamp, or a sodium lamp may be used or a combination of these may be used as the light source. In addition, it is arranged so that the light beams emitted from the plurality of light sources 30a to 30d will have different wavelengths from each other. For example, the first light source 30a emits light of a first wavelength, and the second light source 30b emits light of a second wavelength which is different from the first wavelength. Also, the first light source 30a emits light of a first wavelength band and the second light source 30b emits light of a second wavelength band different from the first wavelength band. However, in order to increase the light amount of a specific wavelength (band), it may be arranged so that a specific plurality of light sources will emit light beams of the same wavelength (band). Note that each of the number of light sources and the number of wavelengths (bands) is not limited to four.

Optical systems 31a, 31b, 31c, and 31d (31a to 31d) are, for example, lenses and are arranged in correspondence with the plurality of light sources 30a to 30d. Each of the optical systems 31a to 31d forms the light beam emitted from a corresponding one of the plurality of light sources 30a to 30d into a desired state (shape). The light beam transmitted through each of the optical systems 31a to 31d is reflected or transmitted by a corresponding one of optical elements 32a, 32b, 32c, and 32d (32a to 32d), and the light beams are multiplexed into a single light beam. The optical elements 32a to 32d are, for example, dichroic mirrors, half mirrors, or the like. In a case in which the wavelength bands of the plurality of light sources 30a to 30d to be used for multiplexing have, for example, a difference equal to or more than about 50 nm, dichroic mirrors can be used for multiplexing. In a case in which multiplexing cannot be efficiently performed by dichroic mirrors because the wavelengths of the plurality of the light sources for multiplexing are the equal to or near each other, half mirrors will be used for multiplexing. Although multiplexing is performed by arranging the plurality of light sources 30a to 30d in series in FIG. 4, multiplexing may be performed by arranging sets of two light sources in parallel. The multiplexing method can be selected in consideration of the type, the wavelengths, and the space of the first light sources 30a to 30d. The controller 37 that drives the light sources is connected to the plurality of the light sources 30a to 30d. The controller 37 can individually change the output energy (light amount from the light source) of each light source by changing the driving current and the applied voltage of the plurality of light sources 30a to 30d. Note that a controller may be provided for each light source.

The light multiplexed by the optical elements 32a to 32d passes through an ND filter 34 and undergoes light amount adjustment. The ND filter 34 is an element that can adjust the intensity of light that passes through the filter, and the transmitted light amount changes depending on, for example, the type and the film thickness of a metal film applied to quartz. To adjust the light amount of the light source unit 23, a plurality of types of filters that have different transmittances from each other are prepared as the ND filter 34, and a filter is switched and inserted in the optical path in accordance with the required light amount. A filter of a scheme in which the transmittance continuously changes depending on the position where the light passes through the filter may also be used. The ND filter 34 adjusts the light amount of the light obtained by multiplexing the light beams from the light sources 30a to 30d.

The light that passed through the ND filter 34 passes a diffusion plate 35 and is guided to a fiber 36. Since a semiconductor laser has a narrow wavelength band of a few nm, noise (speckle noise) will occur in an image to be observed by the interference. Hence, observable speckle noise is reduced by changing the state of the waveform temporally by rotating the diffusion plate 35. The light emitted from the fiber 36 becomes the light emitted from the light source unit 23.

Note an ND filter (changing unit) capable of changing the transmitted light amount can be arranged, in correspondence with each of the plurality of light sources 30a to 30d, in each optical path before the light beam emitted from each light source is multiplexed with the other light beams. A filter of a scheme in which the transmittance continuously changes depending on the position where the light passes through the filter can be used as this ND filter. Also, a plurality of wavelength filters for transmitting light beams of wavelengths with different transmittances from each other may be prepared, and a wavelength selector that arranges a wavelength filter selected among these filters on the optical path between the light sources and the mold 7 may be provided. In addition, light multiplexed by the optical elements 32a to 32d may be demultiplexed by a diffraction grating, and the light amount of each wavelength may be adjusted by adjusting, with respect to the light amount distribution of demultiplexed light, the light amount distribution by an ND filter in which the transmitted light amount changes depending on the location.

Figure 5:
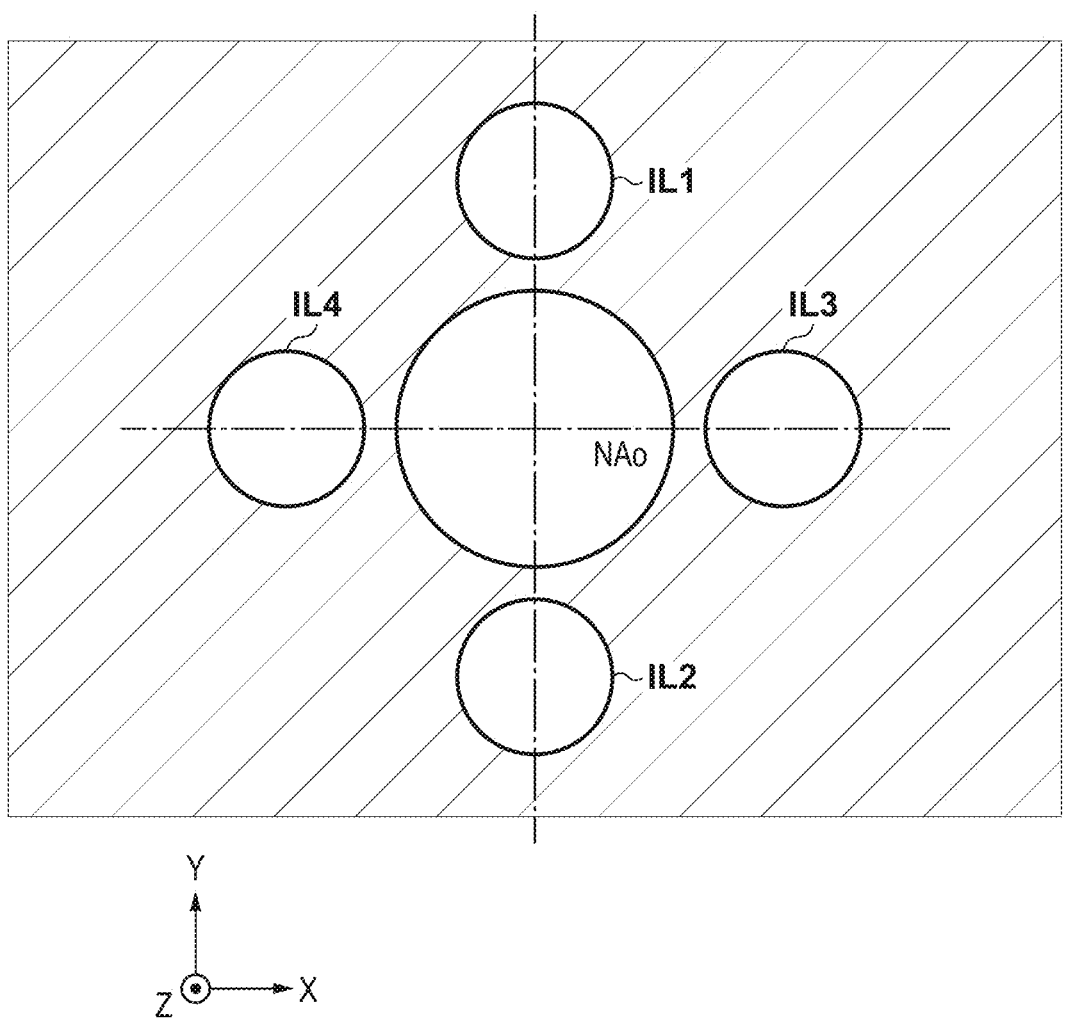
FIG. 5 is a view showing light intensity distribution on a pupil plane of an illumination optical system in the measurement device.

FIG. 5 is a view showing the relationship between light intensity distributions (IL1, IL2, 113, and IL4) on the pupil plane of the illumination optical system 22 of the measurement device 3 and a detection aperture $NA_0$ on the pupil plane of the detection optical system 21. The pupil plane (the aperture stop 28) of the illumination optical system 22 and the aperture (aperture stop 27) of the pupil plane of the detection optical system 21 are displayed overlaying each other in FIG. 5. In this embodiment, the light intensity distributions on the pupil plane of the illumination optical system 22 include the first pole ILL the second pole IL2, the third pole IL3, and the fourth pole IL4 which are circular light intensity distributions. Each pole includes the light intensity peak in the pole. The illumination optical system 22 illuminates the mark 10 and the mark 11, via these poles, with light which obliquely enters from a direction perpendicular to a period direction (first direction) of the diffraction gratings the mark 10 and the mark 11 and light which obliquely enters from a direction parallel to the period direction. As described above, a plurality of poles from the single light source unit 23, that is, the first pole IL1 to the fourth pole IL4 can be formed by arranging the aperture stop 28 on the pupil plane of the illumination optical system 22. When a light intensity distribution that has a plurality of poles (peaks) is formed from light from one light source in this manner, it is possible to simplify or downsize the measurement device 3.

Figure 6:
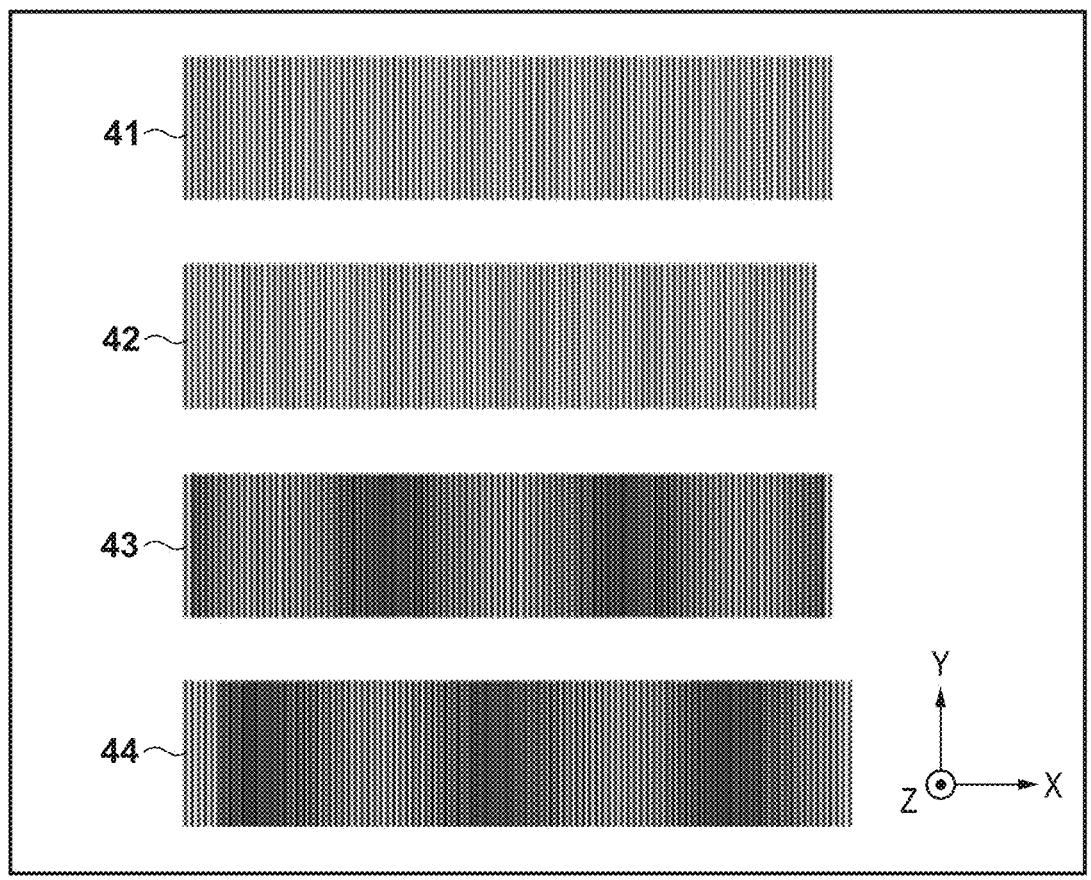
FIG. 6 is a view for explaining a principle for detecting the relative positions between diffraction gratings by using moire.

The principle of generation of a moiré by diffracted light from each diffraction grating mark and the measurement of the relative positions of the marks (the mold 7 and the substrate 8) by using the moiré will be described with reference to FIG. 6. A diffraction grating 41 is a diffraction grating that corresponds to the mark 10 and is arranged in the mold 7. A diffraction grating 42 is a diffraction grating that corresponds to the mark 11 and is arranged in the substrate 8. The periods (grating pitches) of the periodic patterns (gratings) of the diffraction grating 41 and the diffraction grating 42 are slightly different from each other. When the two diffraction gratings that have different grating pitches from each other are brought close together and overlaid, a pattern, that is, a so-called moiré which is a pattern with a period reflecting the periodic difference between the diffraction gratings appears due to the interference of diffracted light beams from the two diffraction gratings. At this time, since the phase of the moiré changes depending on the relative positions of the diffraction gratings, the relative positions of the diffraction grating 41 and the diffraction grating 42, that is, the relative positions of the mold 7 and the substrate 8 can be obtained by detecting the moiré.

More specifically, when the diffraction grating 41 and the diffraction grating 42 that have slightly different grating pitches overlap each other, the diffracted light beams from the diffraction grating 41 and the diffraction grating 42 overlap each other, and thus a moiré 43 having a period reflecting the periodic difference is generated. The position of the bright and dark portions (the phase of the fringes) in the moiré changes depending on the relative positions of the diffraction grating 41 and the diffraction grating 42. For example, when one diffraction grating of the diffraction gratings 41 and 42 is moved in the X direction, the moiré 43 changes to a moiré 44. Since the moiré increases the actual positional deviation amount between the diffraction grating 41 and the diffraction grating 42 and is generated as fringes that have a large period, the relative positions of the diffraction grating 41 and the diffraction grating 42 can be detected highly accurately even if the detection optical system 21 has a low resolution.

A case in which the diffraction gratings 41 and 42 are detected with a bright field (the diffraction gratings 41 and 42 are illuminated from the vertical direction, and the light beams diffracted by the diffraction gratings 41 and 42 in the vertical direction are detected) in order to detect such a moiré will be considered. In this case, the detection optical system 21 will also detect 0th-order light from the diffraction gratings 41 and 42. The 0th-order light will cause the contrast of moire to degrade. Hence, the measurement device 3 has a dark field arrangement in which the 0th-order light is not detected, that is, the diffraction gratings 41 and 42 are illuminated with obliquely incident light beams.

Figure 7:
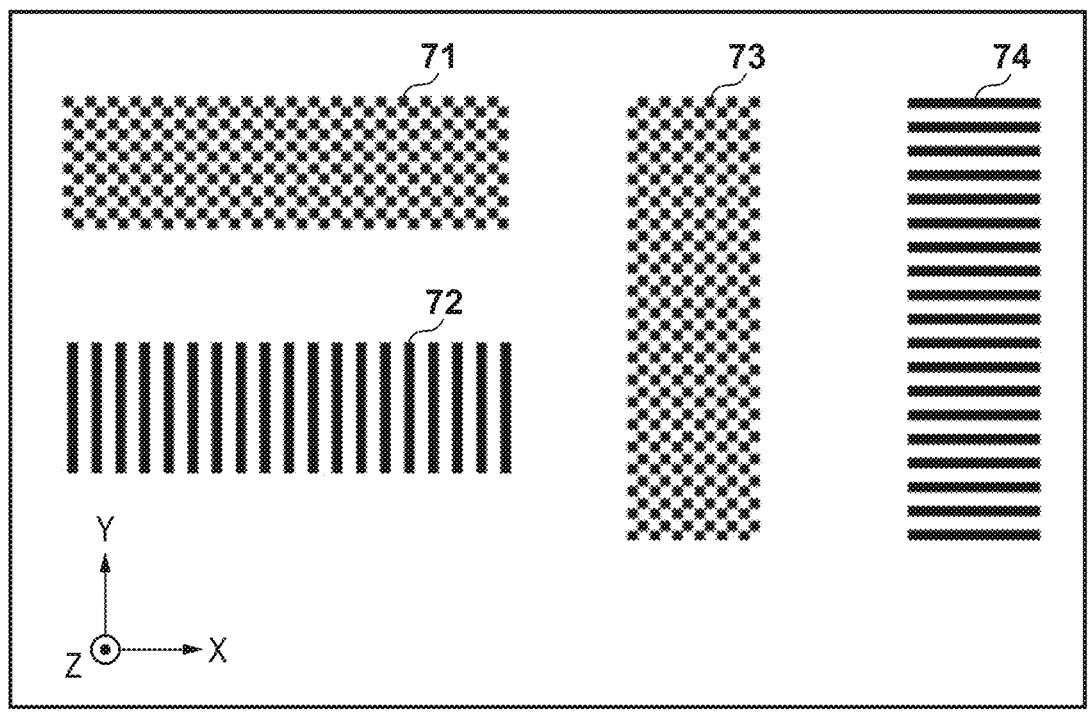
FIG. 7 is a view showing an example of marks for detecting the relative positions in the two X- and Y-directions.

In this embodiment, in order to detect moire even with a dark field arrangement, of the mark 10 and the mark 11, one is set as a first diffraction grating 71 with a checkerboard pattern shown in FIG. 7 and the other is set a second diffraction grating 72 as that shown in FIG. 7. The first diffraction grating 71 is a diffraction grating that has periods in the X direction (first direction) and the Y direction (second direction) perpendicular to the X direction. The second diffraction grating 72 is a diffraction grating that has a period in the X direction (first direction) which is a period different from the period in the first diffraction grating. Note that the first direction and the second direction are not limited to directions perpendicular to each other, and can be measured as long as they are directions different from each other.

Light beams from the first pole IL1 and the second pole IL2 shown in FIG. 5 obliquely enter from the Y-direction side and irradiate the first diffraction grating, the light beams are diffracted in the Y direction and the X direction by the first diffraction grating and are diffracted in the X direction by the second diffraction grating which has a slightly different period (grating pitch). The light diffracted in this manner includes the X-direction relative positional information of the first diffraction grating and the second diffraction grating, enters the detection region ($NA_O$) on the pupil of the detection optical system 21 shown in FIG. 5, and is detected as a moiré by the image sensor 25. The processor 26 can obtain the relative positions of the two diffraction gratings in the X direction (measurement direction) from the image of the moiré captured by the image sensor 25.

The light beams from the third pole IL3 and the fourth pole IL4 shown in FIG. 5 are not used to measure the relative positions of the diffraction grating 71 and the diffraction grating 72 shown in FIG. 7. However, the light beams from the third pole IL3 and the fourth pole IL4 will be used when the relative positions of a diffraction grating 73 and a diffraction grating 74 shown in FIG. 7 are to be detected. The third diffraction grating 73 with a checkerboard pattern shown in FIG. 7 is a diffraction grating that has periods in the X direction and the Y direction perpendicular to the X direction. The fourth diffraction grating 74 shown in FIG. 7 is a diffraction grating that has a period in the Y direction and has a period different from the period in the Y direction of the third diffraction grating 73. Light beams from the third pole IL3 and the fourth pole IL4 obliquely enter from the X-direction side and irradiate the third diffraction grating 73, the light beams are diffracted in the Y direction and the X direction by the third diffraction grating 73 and are diffracted in the Y direction by the fourth diffraction grating 74 which has a slightly different period. The light diffracted in this manner includes the Y-direction relative positional information of the third diffraction grating 73 and the fourth diffraction grating 74, enters the detection region ($NA_O$) on the pupil of the detection optical system 21 shown in FIG. 5, and is detected as a moiré by the image sensor 25. The processor 26 can obtain the relative positions of the third diffraction grating 73 and the fourth diffraction grating 74 in the Y direction (measurement direction) from the image of the moiré captured by the image sensor 25. Note that the light from the first pole IL1 and the second pole IL2 is not used to measure the relative positions of the third diffraction grating 73 and the fourth diffraction grating 74. In this embodiment, the set of the diffraction gratings 71 and 72 and the set of the diffraction gratings 73 and 74 are arranged in the same field of view of the detection optical system 21 (the image sensor 25) to simultaneously detect the relative positions in two directions (X, Y). In this case, it is very effective to illuminate these four diffraction gratings in the light intensity distribution on the pupil plane of the illumination optical system shown in FIG. 5.

Figure 8:
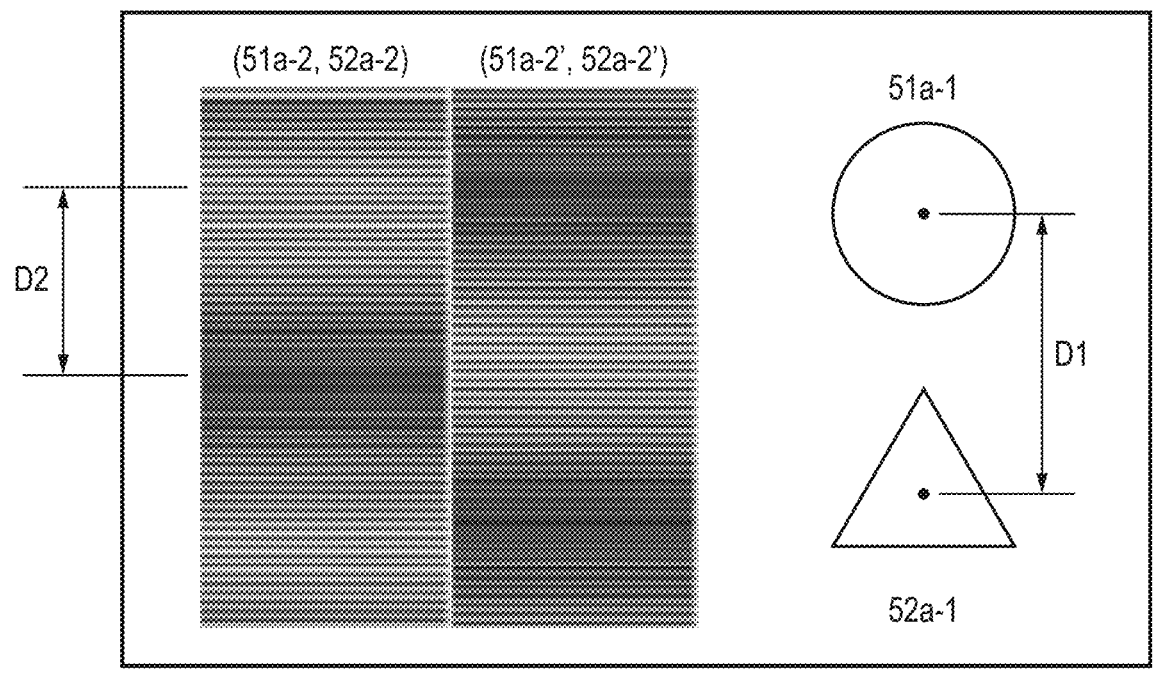
FIG. 8 is a view showing the arrangement of marks to be used in the embodiment.

Alignment marks for measuring the relative positions of the mold 7 and the substrate 8 will be described in detail next. FIG. 8 is a view schematically showing an image of alignment marks which are measured when the mold 7 and the substrate 8 are brought closer together. In this embodiment, other than the marks for fine measurement of the diffraction gratings forming the moiré, a first original-side mark 51a-1 and a first substrate-side mark 52a-1 for coarse measurement will be used. The first original-side mark 51a-1 is included as the mark 10, and the first substrate-side mark 52a-1 is included as the mark 11.

The measurement device 3 can measure (capture) the range within the outer frame of FIG. 8 at once on the imaging plane of the image sensor 25. That is, the image sensor 25 as an imaging device can contain and capture, in its field of view, a plurality of marks within the range of the outer frame of FIG. 8. However, the image sensor is not limited to one sensor, and a plurality of sensors may be used. The processor 26 of the measurement device 3 obtains the image of the first original-side mark 51a-1 and the first substrate-side mark 52a-1 captured by the image sensor 25. The processor 26 then obtains, based on the image, a positional deviation amount D1 of the first original-side mark 51a-1 and the first substrate-side mark 52a-1 (the mold 7 and the substrate 8) with respect to the geometrical center position of each of the first original-side mark 51a-1 and the first substrate-side mark 52a-1 (the mold 7 and the substrate 8) as a reference. Since the first original-side mark 51a-1 and the first substrate-side mark 52a-1 are designed in advance to be a predetermined reference distance apart from each other in the Y direction, the difference between this reference distance and the positional deviation amount D1 is the difference between the relative positions of the first original-side mark 51a-1 and the first substrate-side mark 52a-1. Coarse measurement is performed by using the first original-side mark 51a-1 and the first substrate-side mark 52a-1 in this manner.

Note that the region occupied by the marks can be minimal since the first original-side mark 51a-1 and the first substrate-side mark 52a-1 can be miniaturized. On the other hand, the measurement accuracy of the relative positions obtained by using the first original-side mark 51a-1 and the first substrate-side mark 52a-1 is lower than the measurement accuracy of the relative positions obtained by measuring the moiré by the diffraction gratings. In addition, a difference can be generated in the light amounts of the marks to be detected due to the difference in the reflectances of the first original-side mark 51a-1 and the first substrate-side mark 52a-1. A measurement error is generated by causing the signal of a mark with the large light amount to saturate since irradiation will be performed by using light whose brightness is just enough to detect a mark with a small light amount. Hence, the light amount difference from the mark needs to be suppressed.

In addition, alignment marks of different types (materials, shapes, thicknesses, or the like) are arranged in the first original-side mark 51a-1 and the first substrate-side mark 52a-1. These are a second original-side mark 51a-2 and a second substrate-side mark 52a-2 for fine measurement. Moiré fringes are observed when the second original-side mark 51a-2 and the second substrate-side mark 52a-2 overlap each other. Of the second original-side mark 51a-2 and the second substrate-side mark 52a-2, for example, one is the third diffraction grating 73 with the periodic pattern shown in FIG. 7 and the other is the fourth diffraction grating 74 with the periodic pattern shown in FIG. 7. Since the periods in the measurement direction (Y direction) of the two patterns slightly differ from each other, it generates moiré fringes in which the light amount changes in the Y direction. Although the moiré fringes move in accordance with the changes in the relative positions of the diffraction gratings, the amount of movement of the moiré fringes is larger than the amount of change in the relative positions of the diffraction gratings. Hence, the relative positions of the diffraction gratings can be measured with higher accuracy than the measurement accuracy of the relative positions using the first original-side mark 51a-1 and the first substrate-side mark 52a-1.

Also, the direction of movement of moiré fringes (light amount distribution) when the relative positions of the diffraction gratings change differs depending on the magnitude relationship between the periods of the diffraction gratings of the second original-side mark and the second substrate-side mark. For example, in a case in which the period of the second original-side mark is larger than the period of the second substrate-side mark, the moiré fringes will shift in the +Y direction when the substrate 8 relatively shifts in the +Y direction. On the other hand, in a case in which the period of the second original-side mark is smaller than the period of the second substrate-side mark, the moiré fringes will shift in the −Y direction when the substrate 8 relatively shifts in the +Y direction. Hence, the direction of the relative positional deviation of the diffraction gratings can be understood based on the shift direction of the moiré fringes and the magnitude relationship between the periods of the second original-side mark and the second substrate-side mark.

In addition, a second original-side mark 51a-2' and a second substrate-side mark 52a-2', which are another set of diffraction gratings, are arranged, and the magnitude relationship between the periods in the measurement direction has been switched with that between the second original-side mark 51a-2 and the second substrate-side mark 52a-2. Hence, the two sets of moiré fringes generated by these two sets of diffraction gratings will move in opposite directions to each other when the relative positions of the mold 7 and the substrate 8 change. Therefore, the relative positions of the diffraction gratings can be measured with high accuracy by obtaining a positional deviation amount D2 of these two sets of moiré fringes.

However, since the moiré fringes appear as periodically the same light amount distribution as the relative positional deviation amount of the second original-side mark and the second substrate-side mark increases, the measurement range of the relative positions is small and falls within the range of one period. Hence, the first original-side mark 51a-1 and the first substrate-side mark 52a-1 that have wider measurement ranges can be used to confirm the relative positional deviation of the mold 7 and the substrate 8 in a range larger than this one period. That is, by using the plurality of types of alignment marks described above for measurement, it is possible to measure the relative positional deviation between a portion of the mold 7 and a portion of the substrate 8 in a region to be captured by the image sensor 25. Note that other diffraction gratings that generate moiré fringes can be set if the relative positional deviation, which is obtained by detecting light beams from the marks of the first original-side mark 51a-1 and the first substrate-side mark 52a-1, does not generate a positional error of one period described above. However, the diffraction gratings may have different materials, shapes, thicknesses, or the like.

The illumination light that illuminates the alignment marks described above will be described next. The reflectance of each alignment mark provided in the mold 7 and the substrate 8 differs depending on the material, the pattern shape, the thickness, the process structure of the substrate, or the like and can differ depending on the wavelength.

Figure 9:
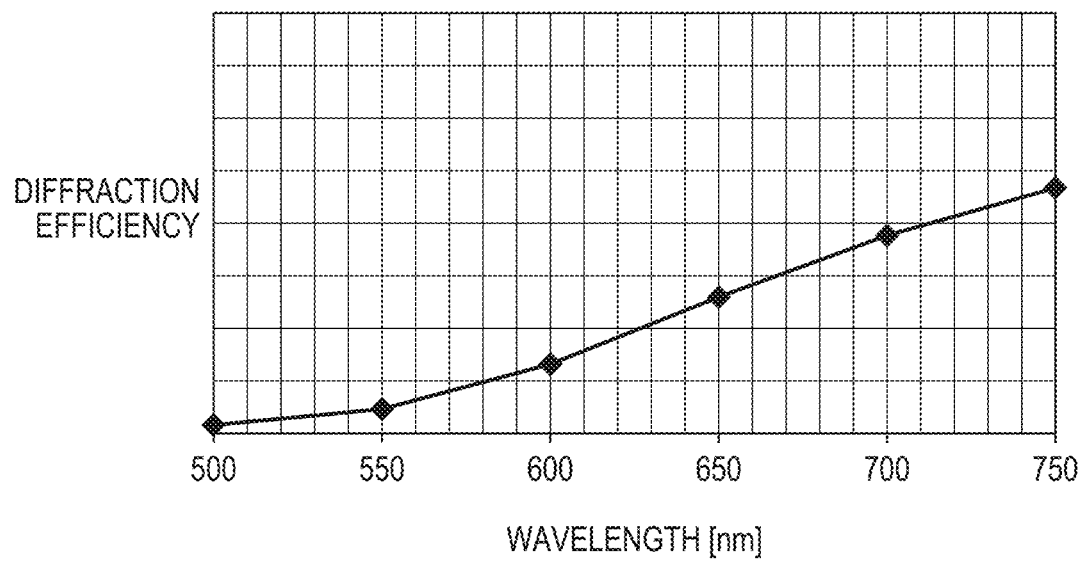
FIG. 9 is a view showing an example of the diffraction grating of a mark provided on a substrate.

FIG. 9 shows an example of the first-order diffraction efficiency of a mark arranged on a substrate. This example shows the simulation result obtained by simulating a mark on a substrate having a structure in which a layer of a material S has been formed on a pattern already formed for process formation. Since the layer of the material S is on the pattern surface of the mark, light that has been transmitted through the material S and reflected by the pattern surface of the mark and further transmitted through the material S is detected as the first-order diffracted light. In this example, the diffraction efficiency is low near a wavelength of 500 nm, and the diffraction efficiency is high near a wavelength of 750 nm. This is due to the contribution of the light absorption by the material S and the thickness of the material S. Hence, it is advantageous to use the light near the wavelength of 750 nm to observe this mark on the substrate.

Figure 10:
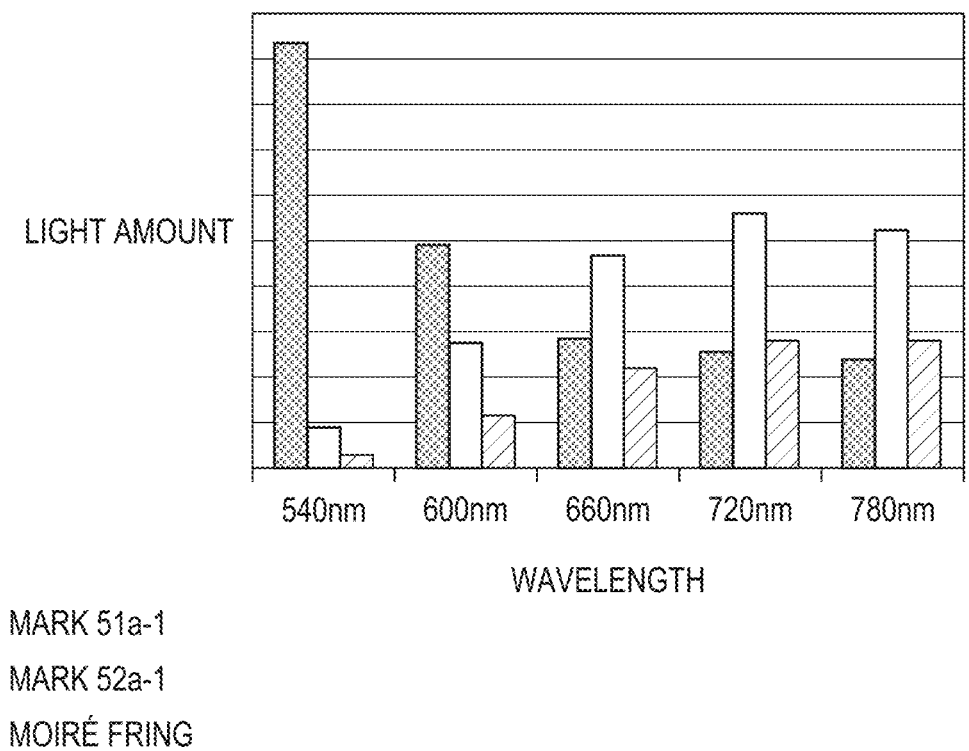
FIG. 10 is a chart illustrating an example of a light amount for each wavelength from each mark.

FIG. 10 shows an example of the light amount of the light from the first original-side mark 51a-1, the light amount of the light from the first substrate-side mark 52a-1, and the light amount of the moiré fringes generated by the second original-side mark 51a-2 and the second substrate-side mark 52a-2. The light amounts of the ordinate represent light amounts from the respective marks when the marks are illuminated by the same light amount, and the light amount of the moiré fringes represent the maximum light amount of the moiré fringes. Note that the moiré fringes represent a light amount distribution that includes the information of the relative positions of the diffraction gratings, and do not include the noise light generated at the edges of the diffraction gratings. In FIG. 10, when attention is paid to the first original-side mark 51a-1, it can be observed that the light amount near the wavelength of 540 nm is large and the light amount near the wavelength of 780 is small. It can be seen that the first substrate-side mark 52a-1 has a small light amount near the wavelength of 540 nm and a maximum light amount near the wavelength of 720 nm. Concerning the moiré fringes, it can be seen that the light amount is small near the wavelength of 540 nm and that the light amount is maximum near the wavelength of 720 nm.

At the wavelength of 540 nm, although the light amount of the light from the first original-side mark 51a-1 is large, the light amount of the light from the first substrate-side mark 52a-1 and the light amount of the moiré fringes are relatively small. Hence, the contrast (S/N ratio) between the light from the first substrate-side mark 52a-1 and the moiré fringes is low, and the detection accuracy may unwantedly degrade at the time of detection by the image sensor 25. Therefore, when these alignment marks are to be illuminated, it is preferable to reduce the light beam near the wavelength of 540 nm among illumination light beams. Thus, of the plurality of the plurality of light sources 30a to 30d, the output energy (light amount) of the light source emitting the light near the wavelength of 540 nm will be reduced.

Subsequently, adjustment is performed so that the relative values of the light amount from the first original-side mark 51a-1, the light amount from the first substrate-side mark 52a-1, and the light amount from the moiré fringes detected by the image sensor 25 will fall within a predetermined range. This adjustment is preferably performed by adjusting the relative amounts of the light amounts of light beams at a plurality of wavelengths (the first wavelength and the second wavelength) emitted from the light source unit 23. The predetermined range here is, for example, about the same light amount. This is because if the light amount difference between the marks is large, the measurement signal of a certain type of mark will be saturated and prevent the detection the measurement signals of other types of marks when the image sensor 25 is to detect the marks, and it will become difficult to accurately measure the relative positions of the marks. Also, in a case in which the light amount difference is large between the marks when illumination light of a single wavelength is used, the light amount difference between the marks can be reduced by adding the light amount difference between the marks obtained when illumination light of another wavelength is used. In particular, it is preferable to adjust the relative amounts of the light amount of the first wavelength and the light amount of the second wavelength so that the relative values of the light amount from the first original-side mark 51a-1, the light amount from the first substrate-side mark 52a-1, and the light amount from the moiré fringes detected by the image sensor 25 will fall within a predetermined range. In a case in which different light sources of different wavelength bands are used as the first light source 30a to 30d, the controller 37 (adjustment unit) will adjust the relative light amounts of the plurality of wavelengths of the light source unit 23 by individually adjusting the light amount (output energy) emitted from each light source so that the detected light amount difference between the marks will be small. In some cases, the output from a light source of a given wavelength may be stopped. That is, the relative amounts of the first wavelength light amount emitted from the first light source and the second wavelength light amount emitted from the second light source are adjusted. In addition, as described above, the ND filter (adjustment unit) provided in the optical path of each light source can be used to adjust the relative amounts of the first wavelength light amount emitted from the first light source and the second wavelength light amount emitted from the second light source. The relative amounts of the light amounts here represent the relative difference between the light amounts such as the light amount difference and the light amount ratio. Note that in a case in which the light amount from each mark on the mold side and the substrate side is to be changed by only an equal amount, control may be performed to set a desired light amount by using the ND filter 34 arranged in the optical path after the light beams of a plurality of wavelengths have been multiplexed. In addition, light amount adjustment may be performed by controlling both the light sources 30a to 30d and the ND filter 34.

Figure 11:
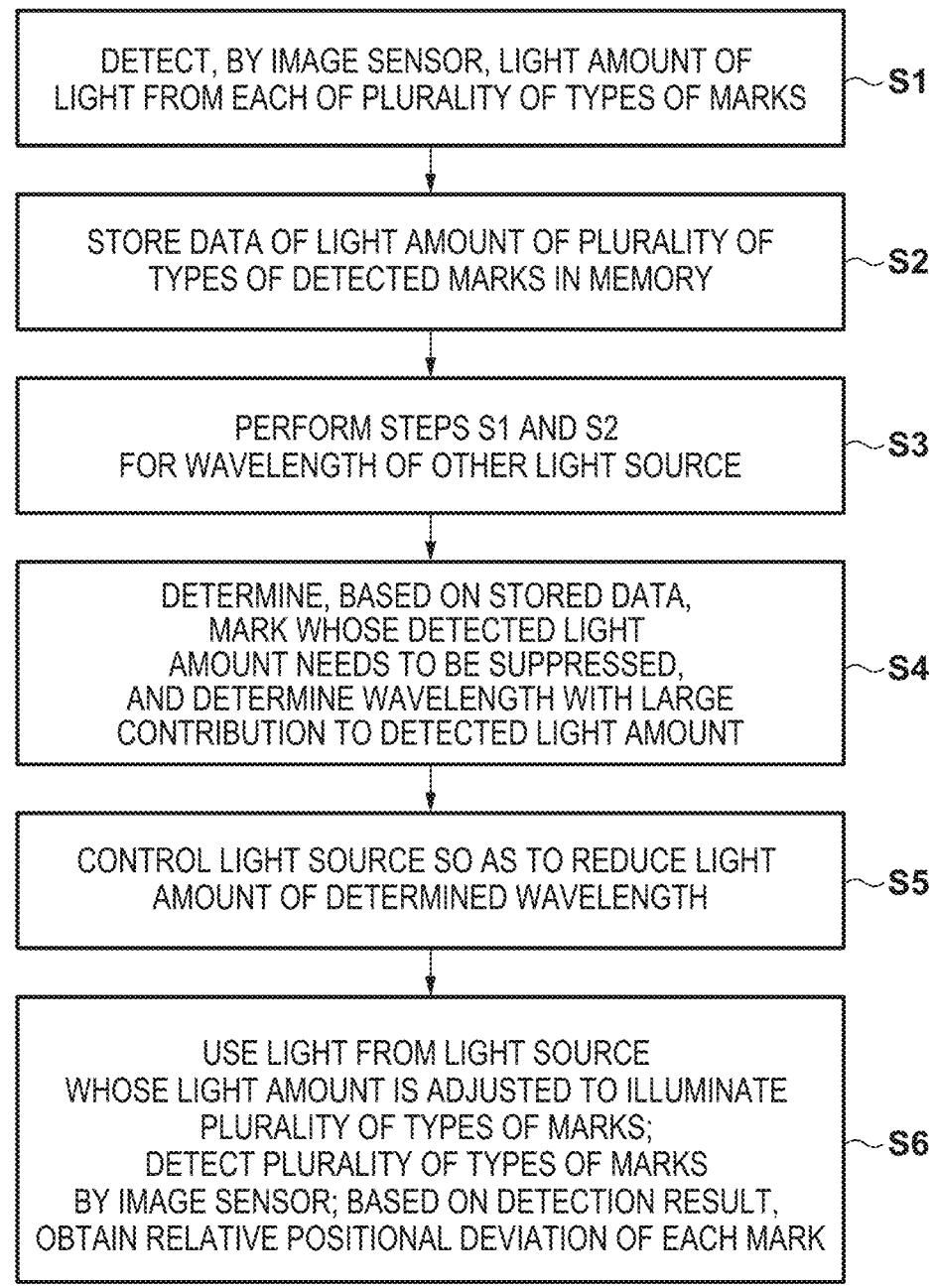
FIG. 11 is a flowchart showing a method of adjusting the light amount from a light source.

The method of adjusting the light amount from the light source unit 23 will be described next. FIG. 11 is a flowchart showing the method of adjusting the light amount from the light source unit 23. Since the light amount difference between the marks will differ depending on the types and the combinations of the plurality of marks arranged in the mold and the substrate, light adjustment is performed in correspondence with the marks provided in the mold and the substrate.

First, light sources, of the plurality of light sources 30a to 30d, other than one light source are turned off or light beams other than the light beam from the light source are shielded. Then, the plurality of types of marks arranged in the mold and the substrate are illuminated by only the light of the first wavelength emitted from the one light source, and the image sensor 25 detects the light amount of the light from each of the plurality of types of marks (step S1). The data of the light amount of each of the plurality of types of marks detected by the image sensor 25 is stored in the memory of the processor 26 that is connected to the image sensor 25 (step S2). Next, the processes of steps S1 and S2 are performed on another light source, for example, the second wavelength which is different from the first wavelength (step S3). As a result, the contribution of each wavelength to the light amount of light from each mark detected when each mark has been illuminated by all of the light sources 30a to 30d (the plurality of wavelengths) is determined. Hence, a mark whose detected light amount needs to be suppressed is specified based on the data stored in the memory, and the wavelength with a large contribution to the detected light amount is determined (step S4). Subsequently, the controller 37 controls the light source unit 23 so as to reduce the light amount of the determined wavelength (step S5). In this case, regarding each light source whose emitted light amount is to be adjusted, it is preferable to perform adjustment in order from a light source that has a larger contribution to the detected light amount. Note that the processes of steps S1 to S5 may be automatically controlled by the controller 12.

Assume that the target of the light amount adjustment is, for example, for the light amount difference between the marks on the mold-side and the substrate-side to fall within a predetermined standard value (tolerance). In addition, a state in which each mark does not have a weak light amount may be set as an additional target. The standard value of the light amount difference of each mark is set so that, for example, the light amount ratio between the first original-side mark 51a-1 and the first substrate-side mark 52a-1 will be equal to or less than fourfold. Additionally, a range in which each mark does not have a weak light amount is a range that can be detected by the image sensor 25, and is, for example, equal to or more than 40% of the maximum light amount that can be detected by the image sensor 25. That is, in steps S4 and S5, the target light amount of the first wavelength and that of the second wavelength will be determined. The target light amount is determined so that relative values of the detected light amount of light from each of the diffraction gratings 51a-2 and 52a-2 and the detected light amount of light from each of the first original-side mark 51a-1 and the first substrate-side mark 52a-1 will fall within the predetermined range. The target light amount is also determined based on the maximum light amount that can be detected by the image sensor 25. The light amount of the light of the first wavelength and the light amount of the light of the second wavelength are adjusted to be the determined target light amount.

The light amount difference between the marks is determined based on the types and the combinations of the marks arranged on the mold 7 and the substrate 8. Hence, for each type of the mold 7 and the substrate 8, the light amount data of each of the plurality of types of marks or the contribution of each wavelength to the light amount of each mark may be obtained and stored in the memory in advance as a database. When measurement is to be actually performed, the relative light amounts of the plurality of wavelengths of the light source unit 23 are adjusted, based on the type of the mold 7 and the substrate 8 and the database, so that the relative values of the detected light amount between the marks will fall within the predetermined range. Note that the relationship between the type of the mold 7 and the substrate 8 and the relative light amounts of the plurality of wavelengths of the light source unit 23 can be stored as the database.

After the light adjustment described above, the plurality of types of marks are illuminated by using each light source whose light amount has been adjusted to detect the plurality of types of marks by the image sensor, and the relative positional deviation of each mark is obtained based on the detection result (step S6).

Note that the wavelength characteristic of the light amount from each mark will differ depending on the type of the mark as shown in FIG. 10. Hence, it is preferable for the measurement device 3 to perform illumination and detection by using light of a wavelength suitable for each mark. With regard to the moiré fringes, the light amount is large at the wavelengths of 720 nm and 780 nm. Hence, it is preferable to detect the light near the wavelengths of 720 nm to 780 nm that have the large light amount for the diffraction gratings 51a-2 and 52a-2. The measurement device 3 may illuminate the diffraction gratings 51a-2 and 52a-2 with only the light near the wavelengths of 720 nm to 780 nm or may illuminate the diffraction gratings with light of a wavelength of a wider band and detect only the light near the wavelengths of 720 nm to 780 nm from the diffraction gratings 51a-2 and 52a-2. In addition, when attention is paid to the first original-side mark 51a-1, it can be observed that the light amount decreases as the wavelength changes from the wavelength of 540 nm to the wavelength of 780 nm. In the case of the first substrate-side mark 52a-1, the light amount is smallest near the wavelength of 540 nm, and the light amount is largest near the wavelength of 720 nm. Hence, for the first original-side mark 51a-1 and the first substrate-side mark 52a-1, it is preferable to detect light of the wavelengths of 600 nm to 660 nm, smaller than 720 nm to 780 nm, to detect both marks at the same amount of light. The measurement device 3 may illuminate the second original-side mark 51a-2 and the second substrate-side mark 52a-2 with only the light of the wavelengths of 600 nm to 660 nm. Alternatively, the measurement device 3 may illuminate the marks with light of a wavelength of a wider band and detect only the light of the wavelengths of 600 nm to 660 nm from the second original-side mark 51a-2 and the second substrate-side mark 52a-2.

In addition, even in a case in which attention is paid to noise light, it can be said that a suitable wavelength will differ for the coarse measurement and the fine measurement of relative positions. Hence, the magnitude of the noise light can be employed as a target when performing light amount adjustment on the wavelengths of the respective light sources. Although it is preferable for the noise light to be absent, there may be a wavelength which has more noise (N) than the measurement signal (S) from each mark depending on the wavelength of the illumination light. Since an error will occur in the measurement of the relative positions of the marks in a state with generation of large noise, the light amount will be adjusted to reduce the noise. This operation will be described in detail hereinafter.

Figure 12:
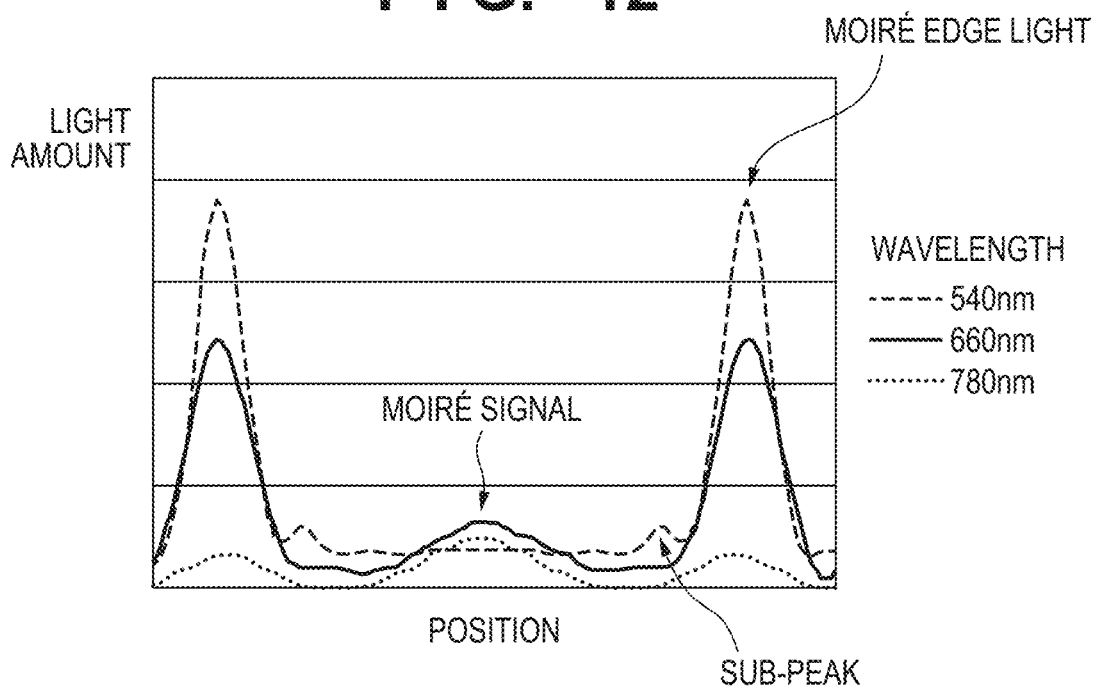
FIG. 12 is a chart illustrating simulation waveforms of light amounts from the diffraction gratings.

The influence from a light beam from a pole not used for the measurement of the relative positions of the first diffraction grating 71 and the second diffraction grating 72 shown in FIG. 7 will be described. For example, the light beams from the third pole IL3 and the fourth pole IL4 shown in FIG. 5 will generate, in the set of the first diffraction grating 71 and the second diffraction grating 72, a scattering or diffraction at the edge portions (both edges of the pattern of the set of diffraction gratings) in the period direction of the set of diffraction gratings. FIG. 12 shows the light measurement signals obtained from a set of the diffraction gratings including the moiré obtained by optical simulation under mold and substrate conditions that may be assumed in a case in which these diffraction gratings are illuminated by the first pole IL1 to fourth pole IL4. FIG. 12 shows the light amount distribution of the light beams from the set of the diffraction gratings that includes the moiré when the set of the diffraction gratings is illuminated with light at each of the wavelengths of 540 nm, 660 nm, and 780 nm. The abscissa represents a position on the set of the diffraction gratings, and the peripheral positions apart from the center correspond to the edge portions in the period direction of the set of diffraction gratings. The ordinate represents the light amount of the light from the set of the diffraction gratings when the se of diffraction gratings is illuminated by each wavelength of the same amount of light. In a case in which the set of the diffraction gratings is illuminated by the wavelength of 540 nm, there are peaks near both edges of each diffraction grating pattern, indicating a large amount of light. Also, small sub-peaks have also been generated. These sub-peaks are considered to be light beams that are generated when the continuous pattern (grating condition) of the set of the diffraction gratings is interrupted by the edge portions. Note that although this kind of phenomenon is generated when the set of the diffraction gratings is to be detected in the bright field, it can be confirmed especially significantly when the set of the diffraction gratings is detected in the dark field. When light beams generated at both edges of a diffraction grating pattern or light beams of sub-peaks in this manner mix with a moiré signal, it can cause an error to be generated in the detection of the moiré signal which includes the information of the relative positions of the diffraction gratings. Note that it can be observed that the concave-convex waveform of the moiré fringes which include the information of the relative positions of the diffraction gratings is hardly generated at the wavelength of 540 nm. That is, since the light of the wavelength of 540 nm acts only as noise, it is preferable not to use this light for the detection of the moiré fringes. Although the edge portions of the set of the diffraction gratings have a large amount of light when the set of the diffraction grating is illuminated by light of the wavelength of 660 nm, the concave-convex (bright-dark) portions of the moiré signal can be confirmed. Also, in a case in which the set of the diffraction gratings is illuminated with light of the wavelength 780 nm, it can be seen that the light amounts at the edge portions of the set of the diffraction gratings are smaller than the light amount of the moiré signal. In this manner, the light amount distribution of the light beams from the set of the diffraction grating when the relative positions of the diffraction gratings are to be measured differs depending on the wavelength, and the magnitude of the noise component also differs depending on the wavelength.

Hence, the controller 37 reduces the noise light from the diffraction gratings by controlling the light source unit 23 so as to reduce, among the light beams which illuminate the diffraction gratings, the light amount of the light of the wavelength of 540 nm that generates the noise light. The light amount of each wavelength can be adjusted so as to reduce the noise light at the edges of the set of the diffraction gratings in a range that ensures the detected light amount of the light beams from the first original-side mark 51a-1 and the first substrate-side mark 52a-1 and the moiré fringes and in which the light amount ratio of these marks will not be, for example, equal to or more than fourfold.

The light amount adjustment described above can be performed based on the stored data by storing, in addition to the detected light amounts of the respective marks, the noise light amount data of the diffraction grating edges as the target of the light amount adjustment in the memory. It can be considered here that the light amount of the moiré fringes will also be reduced when the light amount of a specific wavelength is reduced to reduce the noise light amount. The measurement error may increase if the light amount of the moiré fringes is reduced more than the reduction in the noise light amount. More simply, in a case in which the light amount of the diffraction grating edges becomes equal to or more than two times the light amount of the moiré fringes, the light noise amount of the diffraction grating edges will become larger than the light amount of the moiré fringes because the light amount peaks are present at the diffraction grating edges and the light amount of the diffraction edges=the light amount of the moiré fringes+the noise light amount. Hence, the light amount of the wavelength of each light source is adjusted so that the detected light amount of the light beams from the diffraction grating edges to be detected will be smaller than two times the detected light amount of the light from the center of the diffraction gratings. In this manner, by making the light amount of a wavelength that has a large influence on the noise light smaller than the contribution to the light amount of the moiré fringes, it becomes possible to reduce the measurement error in the relative positions of the marks.

According to the processing described above, the relative positions between marks can be obtained with high accuracy by reducing the influence of the noise light from the diffraction grating edges and reducing the relative amounts of the detected light amounts of the coarse measurement marks and the detected light amounts of the fine measurement amounts.

An example of the light source control in the measurement device 3 will be described hereinafter. The measurement device 3 sets the condition of the light wavelength to be emitted from the illumination optical system 22 to the first condition, and causes the illumination optical system 22 to perform illumination. More specifically, as the first condition, illumination is performed by turning on, among the plurality of light sources 30a to 30d, at least the output of each light source that emits light at a wavelength of 600 nm to 660 nm. By the illumination performed under the first condition, the measurement device 3 detects the light beams from the first original-side mark 51a-1 and the first substrate-side mark 52a-1 by the image sensor 25 and obtains the relative positions of the first original-side mark 51a-1 and the first substrate-side mark 52a-1. The measurement device 3 performs the coarse measurement in this manner. Next, the measurement device 3 changes the condition of the light wavelength to be emitted from the illumination optical system 22 to the second condition, and causes the illumination optical system 22 to perform illumination. More specifically, as the second condition, illumination is performed by turning on, among the plurality of light sources 30a to 30d, only the output of each light source that emits light at a wavelength of 720 nm to 780 nm. By the illumination performed under the second condition, the measurement device 3 detects the moiré fringes from the second original-side mark 51a-2 and the second substrate-side mark 52a-2 by the image sensor 25 and obtains the relative positions of the second original-side mark 51a-2 and the second substrate-side mark 52a-2 (that is, the mold and the substrate). The measurement device 3 performs the fine measurement in this manner.

Figure 13:
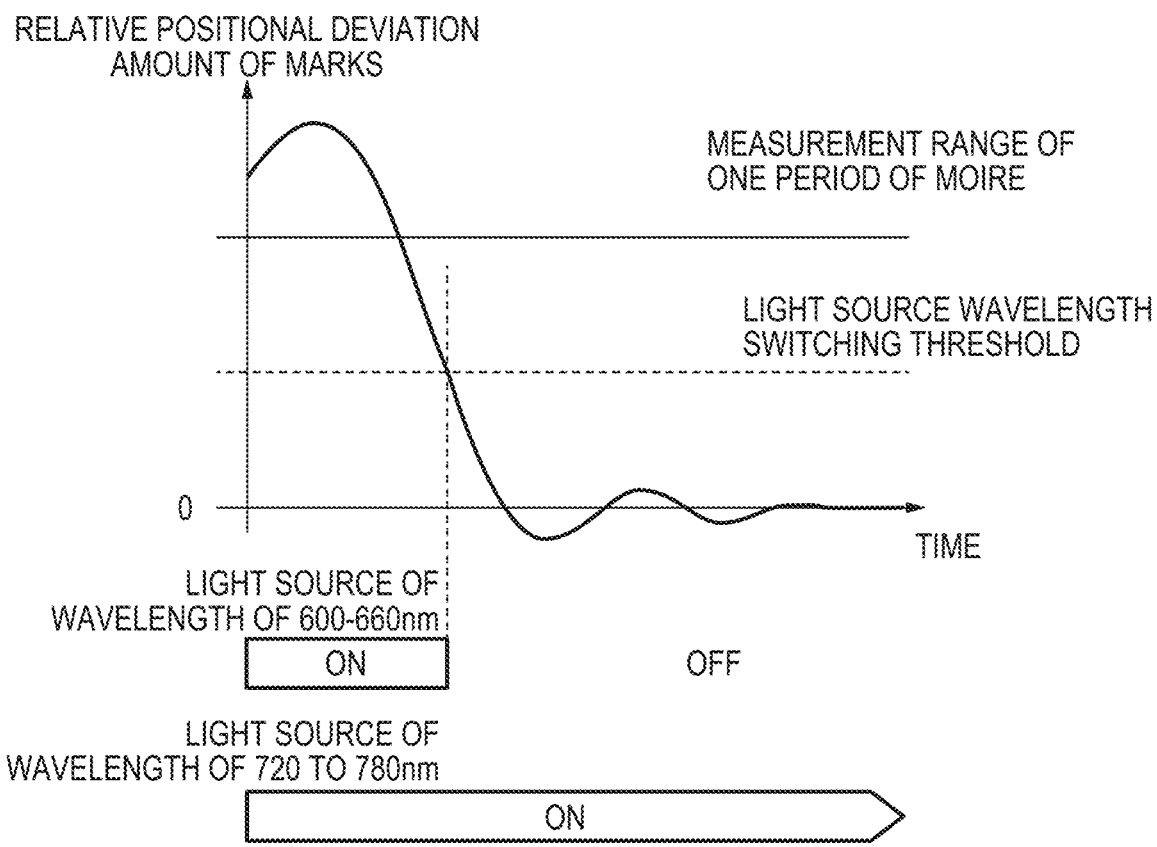
FIG. 13 is a chart for explaining an example of light source switching timings.

The illumination timings of each mark will be described with reference to FIG. 13. First, the measurement device 3 turns on both each light source that emits light at a wavelength of 600 nm to 660 nm and each light source that emits light at a wavelength of 720 nm to 780 nm (illumination under the first condition). The measurement device 3 performs coarse measurement based on the images of the first original-side mark 51a-1 and the first substrate-side mark 52a-1 obtained by the illumination performed under the first condition. The controller 12 controls the driving of the driving unit which includes the substrate stage 5 and the mold magnification correction mechanism of the mold holder 4 so as to reduce the positional deviation measured by the coarse measurement operation. The measurement device 3 can shift to the fine measurement operation when the coarse measurement result indicates that the positional deviation is within the measurement range of the fine measurement operation. In the example shown in FIG. 13, the measurement device 3 will shift to the fine measurement operation when the positional deviation amount measured by the coarse measurement operation is equal to or less than a sufficiently small threshold in the measurement range (measurement range of one period of moiré) of the fine measurement operation. When the operation is to be shifted to the fine measurement operation, the measurement device 3 will turn off each light source that emits the light of a wavelength of 600 nm to 660 nm (illumination under the second condition). At this time, the light detection from each mark is turned on or off accordingly. The controller 12 controls the driving of the driving unit that includes the substrate stage 5 and the mold magnification correction mechanism of the mold holder 4 so as to reduce the positional deviation measured by the fine measurement operation.

As described above, according to this embodiment, since the relative values of the light amounts of the detected marks will fall within a predetermined range, the relative positions of the marks can be obtained accurately from the detection results of the plurality of types of marks.

Note that although an example in which the light amount of each wavelength emitted from the light source unit 23 is adjusted in the light source unit 23 as light amount adjustment was described above, the present invention is not limited to this, and light amount adjustment may be performed on the side of the detector. For example, a color filter may be provided on the side of the detector and the relative value of the detected light amount of each wavelength detected by the sensor may be adjusted. Also, it may be arranged so that the light beams of respective wavelengths will be detected by a plurality of sensors by dividing the light from each mark for each wavelength by a dichroic mirror and causing the light beams to enter the sensors. Subsequently, the relative value of the detected light amount of each wavelength detected by the corresponding sensor may be adjusted by changing the transmitted light amount of the ND filter.

Second Embodiment

Figure 14:
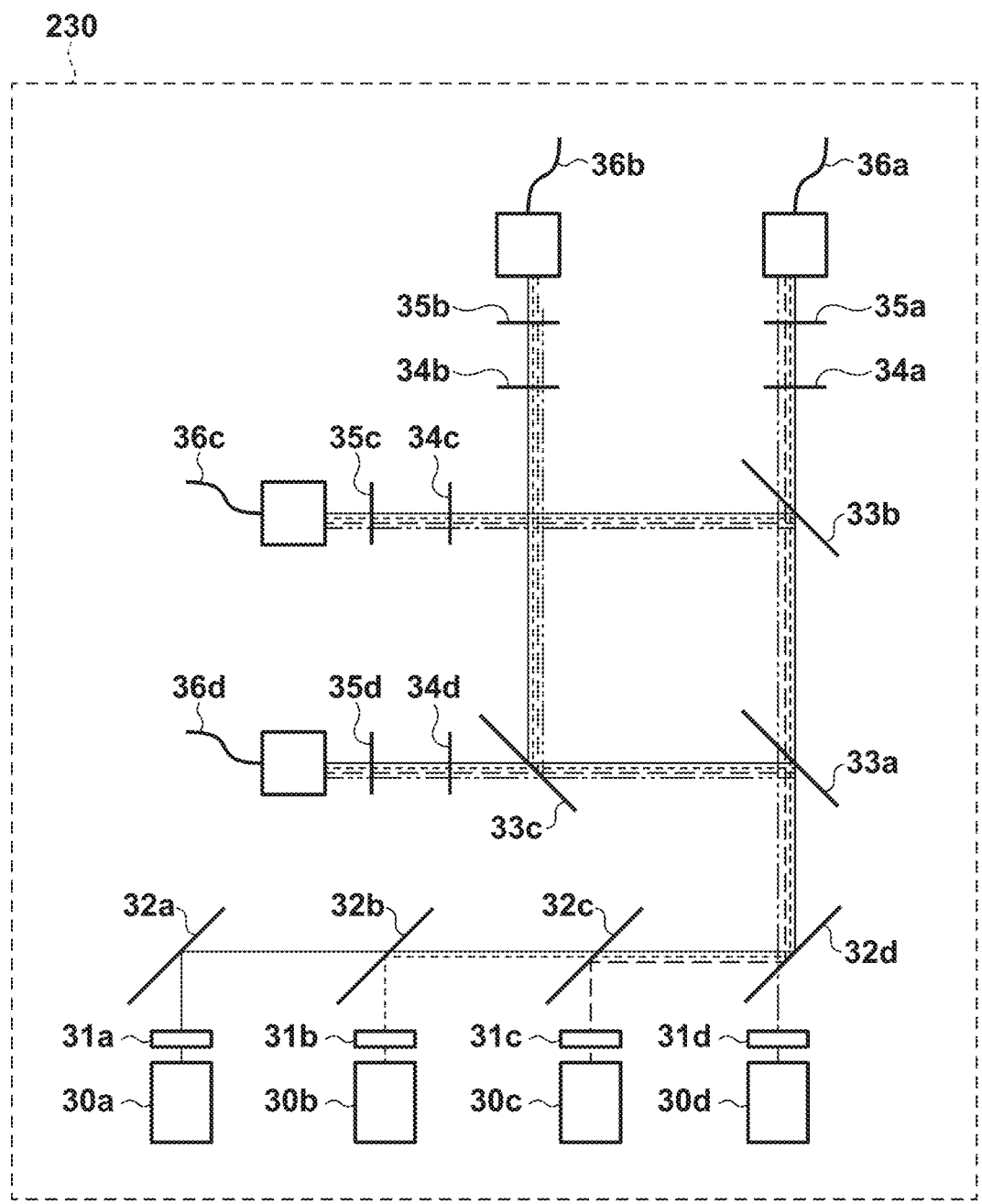
FIG. 14 is a view showing a modification of the arrangement of the light source.

The first embodiment described above showed an arrangement in which light is emitted from one fiber 36 of one light source unit 23 to one measurement device 3. In this embodiment, light beams are emitted to a plurality of measurement devices 3 via a plurality of fibers from one light source unit 230. The light source unit 230 generates, as shown in FIG. 14, four light source light beams by arranging half mirrors 33a, 33b, and 33c in an optical path to branch the optical path and causing the branched light beams to enter the fibers 36a, 36b, 36c, and 36d. For example, the light beam emitted from the fiber 36a is used as the light of a light source unit 23 of a first measurement apparatus, and the light beam emitted from the fiber 36b can be used as the light of a light source of another measurement apparatus. An ND filter 34a and a diffusion plate 35a are arranged in the optical path between the half mirror 33b and the fiber 36a,
and an ND filter 34b and a diffusion plate 35b are arranged in the optical path between the half mirror 33c and the fiber 36b. In addition, an ND filter 34c and a diffusion plate 35c are arranged in the optical path between the half mirror 33b and the fiber 36c, and an ND filter 34d and a diffusion plate 35d are arranged in the optical path between the half mirror 33c and the fiber 36d. As a result, light amount adjustment of the light of each light source and speckle noise reduction can be performed.

Using a plurality of measurement apparatuses for measuring the relative positions of the substrate and the mold in this manner allows, for example, relative positions of marks to be measured in a plurality of locations where positions are apart such as in, for example, the four corners (four regions) of a shot region of the substrate. Subsequently, distortions such as the magnification and the rotation of the substrate and the mold can be obtained from the measurement result. In addition, by performing alignment so as to minimize the relative positional deviation of the marks in each of the four regions, the pattern of the substrate and the pattern of the mold can be overlaid with high accuracy across the entire single shot region. Note that although three optical path branching elements (the half mirrors 33a, 33b, and 33c) are used in FIG. 14, the number of the optical branching elements is not limited to this.

[Embodiment of Method of Manufacturing Article]

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 15:
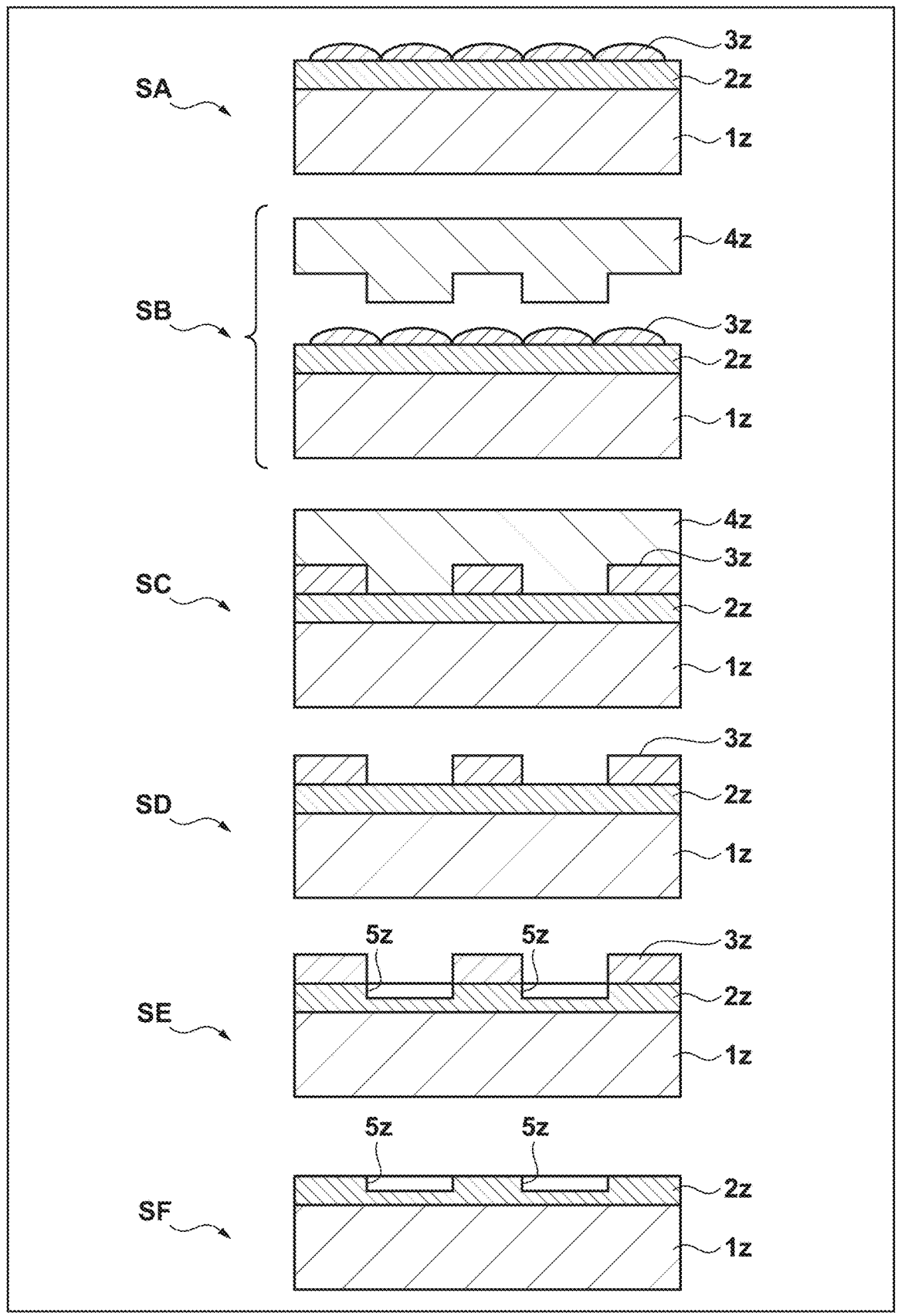
FIG. 15 is a view for explaining a method of manufacturing an article.

A more specific method of manufacturing an article will be described next with reference to FIG. 15. In step SA, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

In step SB, a side of a mold 4z for imprint with a convex-concave pattern is directed to and caused to face the imprint material 3z on the substrate. In step SC, the substrate 1 to which the imprint material 3z is applied is brought into contact with the mold 4z, and a pressure is applied. The gap between the mold 4z and the processed material 2z is filled with the imprint material 3z. The imprint material 3z is cured when it is irradiated with energy for curing via the mold 4z in this state.

In step SD, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z has been transferred to the imprint material 3z.

In step SE, when etching is performed using the pattern of the cured product as an etching resistant mask, a portion of the surface of the processed material 2z where the cured product does not exist or remains thin is removed to form a groove 5z. In step SF, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

According to the present invention, for example, a technique advantageous in increasing the accuracy of alignment of an original and a substrate can be provided.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An alignment apparatus that aligns an original and a substrate, comprising:
   an original holder configured to hold the original;
   a substrate holder configured to hold the substrate; and
   a measurement device including an illuminator configured to illuminate a first original-side mark for coarse measurement and a second original-side mark for fine measurement arranged in one of the original and the original holder and a first substrate-side mark for coarse measurement and second substrate-side mark for fine measurement arranged in one of the substrate and the substrate holder, and configured to measure a positional deviation between the original and the substrate,
   wherein the measurement device is configured to perform coarse measurement based on light beams from the first original-side mark and the first substrate-side mark by causing the illuminator to illuminate the first original-side mark and the first substrate-side mark under a first condition, and perform fine measurement based on light beams from the second original-side mark and the second substrate-side mark by causing the illuminator to illuminate the second original-side mark and the second substrate-side mark under a second condition,
   wherein the first condition is a condition of a wavelength selected from wavelengths of light to be emitted from the illuminator so that a difference between an amount of light from the first original-side mark and an amount of light from the first substrate-side mark is within a predetermined range, and
   wherein the second condition is a condition of a wavelength selected from wavelengths of light to be emitted from the illuminator so that an amount of light from the second original-side mark and the second substrate-side mark is large.

2. The alignment apparatus according to claim 1, wherein the measurement device is configured to shift to the fine measurement when a result of the coarse measurement indicates that the positional deviation falls within a measurement range of the fine measurement.

3. The alignment apparatus according to claim 1,
   wherein the illuminator includes a plurality of light sources configured to emit light beams having different wavelengths, and
   wherein the measurement device is configured to switch between the first condition and the second condition by adjusting an output from each of the plurality of light sources.

4. The alignment apparatus according to claim 3, wherein the plurality of light sources included a plurality of semiconductor lasers that output light beams having different wavelengths.

5. The alignment apparatus according to claim 1,
   wherein the illuminator includes a light source and a wavelength selector configured to arrange a wavelength filter, selected from a plurality of wavelength filters which transmit light beams having different wavelengths, to an optical path between the light source and the original, and
   wherein the measurement device is configured to switch between the first condition and the second condition by selecting the plurality of wavelength filters.

6. The alignment apparatus according to claim 1, wherein the measurement device includes an imaging device configured to capture an image of the first original-side mark, the first substrate-side mark, the second original-side mark, and the second substrate-side mark by including the first original-side mark, the first substrate-side mark, the second original-side mark, and the second substrate-side mark in a field of view, and perform the coarse measurement and the fine measurement based on the image captured by the imaging device.

7. The alignment apparatus according to claim 1, wherein the coarse measurement is measurement of relative positions of the original and the substrate based on a distance between the first original-side mark and the first substrate-side mark.

8. The alignment apparatus according to claim 7,
wherein the second original-side mark and the second substrate-side mark include diffraction gratings with grating patterns that have different grating pitches from each other, and
wherein the fine measurement is measurement of the relative positions of the original and the substrate by using a moiré generated when the second original-side mark and the second substrate-side mark are overlaid.

9. An alignment method of aligning an original held by an original holder and a substrate held by a substrate holder, the method comprising:
illuminating, using an illuminator, under a first condition, a first original-side mark for coarse measurement and a second original-side mark for fine measurement arranged in one of the original and the original holder, and a first substrate-side mark for coarse measurement and a second substrate-side mark for fine measurement arranged in one of the substrate and the substrate holder;
performing coarse measurement of a positional deviation between the original and the substrate based on light beams obtained from the first original-side mark and the first substrate-side mark by the illumination performed under the first condition;
performing illumination, using the illuminator, by changing the first condition to a second condition after the coarse measurement; and
performing fine measurement of the positional deviation based on light beams obtained from the second original-side mark and the second substrate-side mark by the illumination performed under the second condition,
wherein the first condition is a condition of a wavelength selected from wavelengths of light to be emitted from the illuminator so that a difference between an amount of light from the first original-side mark and an amount of light from the first substrate-side mark is within a predetermined range, and
wherein the second condition is a condition of a wavelength selected from wavelengths of light to be emitted from the illuminator so that an amount of light from the second original-side mark and the second substrate-side mark is large.

10. A lithography apparatus comprising an alignment apparatus that aligns an original and a substrate,
wherein the alignment apparatus comprises:
an original holder configured to hold the original;
a substrate holder configured to hold the substrate; and
a measurement device including an illuminator configured to illuminate a first original-side mark for coarse measurement and a second original-side mark for fine measurement arranged in one of the original and the original holder and a first substrate-side mark for coarse measurement and second substrate-side mark for fine measurement arranged in one of the substrate and the substrate holder, and configured to measure a positional deviation between the original and the substrate,
wherein the measurement device is configured to perform coarse measurement based on light beams from the first original-side mark and the first substrate-side mark by causing the illuminator to illuminate the first original-side mark and the first substrate-side mark under a first condition, and perform fine measurement based on light beams from the second original-side mark and the second substrate-side mark by causing the illuminator to illuminate the second original-side mark and the second substrate-side mark under a second condition,
wherein the first condition is a condition of a wavelength selected from wavelengths of light to be emitted from the illuminator so that a difference between an amount of light from the first original-side mark and an amount of light from the first substrate-side mark is within a predetermined range, and
wherein the second condition is a condition of a wavelength selected from wavelengths of light to be emitted from the illuminator so that an amount of light from the second original-side mark and the second substrate-side mark is large, and
wherein the lithography apparatus is configured to transfer a pattern of an original held by an original holder to a substrate held by a substrate holder of the alignment apparatus.

11. A method of manufacturing an article comprising:
transferring a pattern to a substrate by using a lithography apparatus defined in claim 10; and
processing the substrate to which the pattern has been transferred,
wherein the article is manufactured from the processed substrate.

12. The alignment apparatus according to claim 8, wherein the second condition is a condition of a wavelength selected from wavelengths of light to be emitted from the illuminator so that an amount of light of moiré is larger than in the first condition.

* * * * *